(12) United States Patent
Son

(10) Patent No.: US 9,953,702 B2
(45) Date of Patent: Apr. 24, 2018

(54) SEMICONDUCTOR MEMORY DEVICES, MEMORY SYSTEMS INCLUDING THE SAME AND METHODS OF OPERATING THE SAME

(71) Applicant: Samsung Electronics Co., Ltd., Suwon-si (KR)

(72) Inventor: Jong-Pil Son, Seongnam-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/594,891

(22) Filed: May 15, 2017

(65) Prior Publication Data

US 2018/0053545 A1 Feb. 22, 2018

(30) Foreign Application Priority Data

Aug. 17, 2016 (KR) .................. 10-2016-0103992

(51) Int. Cl.
| | |
|---|---|
| *G11C 7/00* | (2006.01) |
| *G11C 11/419* | (2006.01) |
| *G06F 11/10* | (2006.01) |
| *G11C 7/18* | (2006.01) |
| *G11C 29/04* | (2006.01) |
| *G11C 7/08* | (2006.01) |

(52) U.S. Cl.
CPC ........ *G11C 11/419* (2013.01); *G06F 11/1048* (2013.01); *G11C 7/08* (2013.01); *G11C 7/18* (2013.01); *G11C 29/04* (2013.01)

(58) Field of Classification Search
CPC ..... G11C 11/419; G11C 11/1048; G11C 7/08; G11C 7/18
USPC .................. 365/189.04, 200, 201
See application file for complete search history.

(56) References Cited

U.S. PATENT DOCUMENTS

| | | | |
|---|---|---|---|
| 5,396,641 A | 3/1995 | Iobst et al. | |
| 6,631,488 B1 | 10/2003 | Stambaugh et al. | |
| 8,122,323 B2 | 2/2012 | Leung et al. | |
| 8,375,257 B2 * | 2/2013 | Hong ............... | G06F 11/10 714/48 |
| 8,402,326 B2 | 3/2013 | Singh | |
| 8,429,496 B2 | 4/2013 | Yamada et al. | |
| 8,583,898 B2 | 11/2013 | Greyzck | |
| 8,762,813 B2 | 6/2014 | Tang et al. | |
| 2013/0061113 A1 * | 3/2013 | Kim ............... | G06F 11/1048 714/758 |

(Continued)

*Primary Examiner* — Vu Le
(74) *Attorney, Agent, or Firm* — Muir Patent Law, PLLC

(57) ABSTRACT

A semiconductor memory device includes a memory cell array, a control logic circuit, an internal processing circuit, and an error correction circuit. The control logic circuit generates an internal processing mode signal in response to a command from a memory controller. The internal processing circuit selectively performs the internal processing operation on a first set of data read from the memory cell array to output a processing result data, in response to the internal processing mode signal. The error correction circuit performs an error correction code (ECC) encoding on the processing result data to generate a second parity data and stores the processing result data and the second parity data in the memory cell array. The error correction circuit generates the second parity data by selecting the same ECC of a plurality of ECCs as a first ECC.

20 Claims, 21 Drawing Sheets

(56) References Cited

U.S. PATENT DOCUMENTS

2014/0047306 A1    2/2014  Perego
2014/0317478 A1   10/2014  Anholt
2014/0331101 A1*  11/2014  Chung .................. G06F 11/085
                                                                     714/755

* cited by examiner

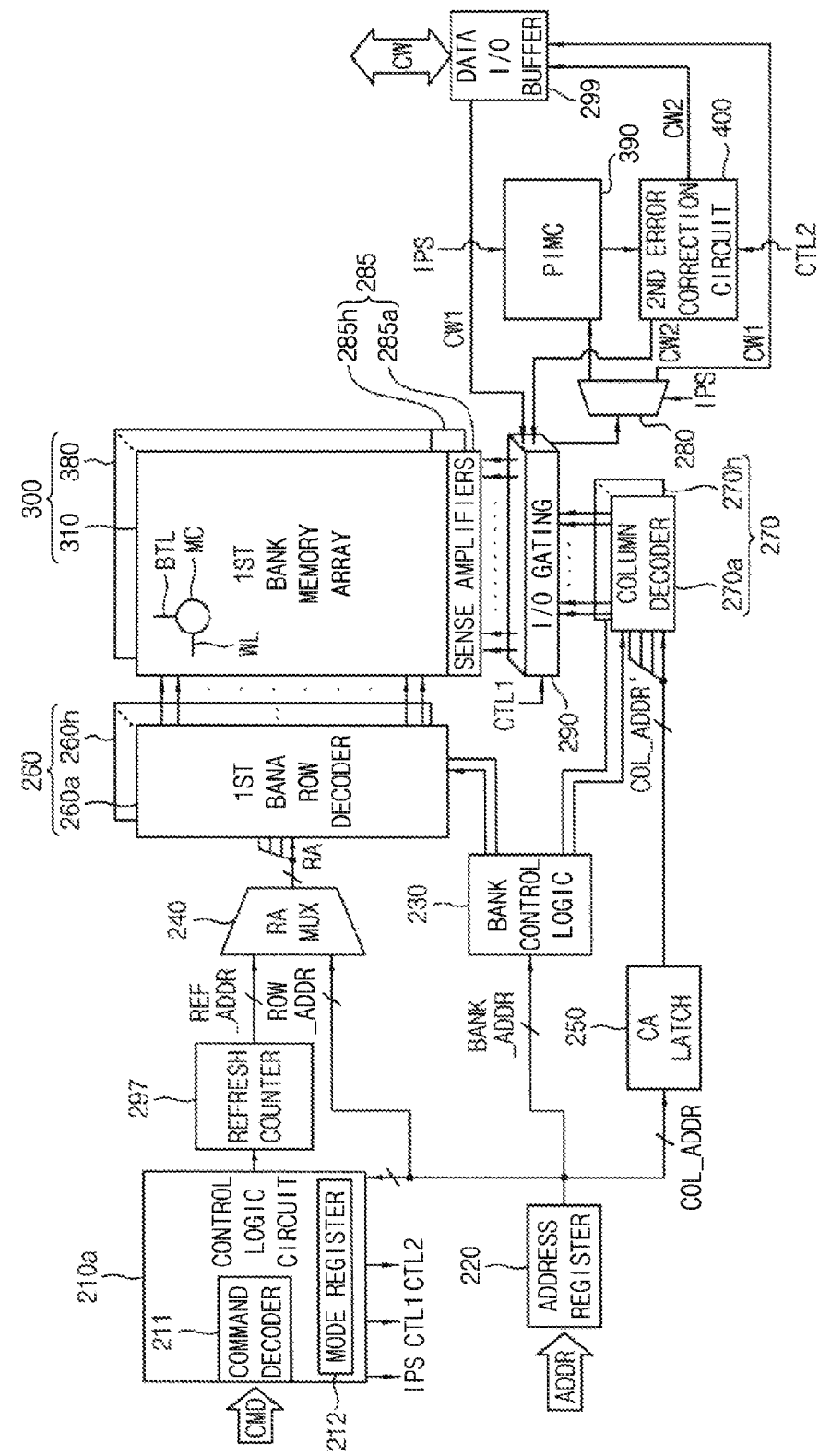

SEMICONDUCTOR MEMORY DEVICES, MEMORY SYSTEMS INCLUDING THE SAME AND METHODS OF OPERATING THE SAME

CROSS-REFERENCE TO RELATED APPLICATIONS

This US application claims the benefit of priority under 35 USC § 119 to Korean Patent Application No. 10-2016-0103992, filed on Aug. 17, 2016, in the Korean Intellectual Property Office, the content of which is incorporated herein in its entirety by reference.

BACKGROUND

The present disclosure relates to memories, and more particularly to semiconductor memory devices, memory systems including the same and methods of operating the same.

Semiconductor memory devices may be classified into non-volatile memory devices such as flash memory devices and volatile memory devices such as DRAMs. High speed operation and cost efficiency of DRAMs make it possible for DRAMs to be used for system memories. However, due to the continuing shrinking in fabrication design rules of DRAMs, bit errors of memory cells in the DRAMs may rapidly increase.

SUMMARY

Some exemplary embodiments may provide a semiconductor memory device, capable of enhancing performance.

Some exemplary embodiments may provide a memory system including the semiconductor memory device.

Some exemplary embodiments may provide method of operating a semiconductor memory device, capable of enhancing performance According to exemplary embodiments, a semiconductor memory device includes a memory cell array, a control logic circuit, an internal processing circuit and an error correction circuit. The memory cell array includes a plurality of memory cells coupled to a plurality of word-lines and a plurality of bit-lines. The control logic circuit generates an internal processing mode signal designating whether to perform an internal processing operation in response to a command received from a memory controller. The internal processing circuit outputs a processing result data by selectively performing the internal processing operation on a first set of data read from the memory cell array, in response to the internal processing mode signal. The error correction circuit generates a second parity data by performing an error correction code (ECC) encoding on the processing result data and stores the processing result data and the second parity data in the memory cell array. The error correction circuit generates the second parity data by selecting the same ECC of a plurality of ECCs as a first ECC which is used for generating a first parity data of the first set of data.

According to exemplary embodiments, a memory system includes at least one semiconductor memory device and a memory controller. The memory controller controls the at least one semiconductor memory device. The memory controller generates a first parity data by performing an error correction code (ECC) encoding on a write data using a first ECC and transmits the write data and the first parity data to the at least one semiconductor memory device. The at least one semiconductor memory device includes memory cell array, a control logic circuit, an internal processing circuit and a first error correction circuit. The memory cell array includes a plurality of memory cells coupled to a plurality of word-lines and a plurality of bit-lines and stores the write data and the first parity data. The control logic circuit generates an internal processing mode signal designating whether to perform an internal processing operation in response to a command from the memory controller. The internal processing circuit outputs a processing result data by selectively performing the internal processing operation on a first set of data including the write data and the first parity data, in response to the internal processing mode signal. The first error correction circuit generates a second parity data by performing an ECC encoding on the processing result data and stores the processing result data and the second parity data in the memory cell array. The first error correction circuit generates the second parity data by selecting the same ECC of a plurality of ECCs as the first ECC which the memory controller uses for generating the first parity data.

According to exemplary embodiments, in a method of operating a semiconductor memory device comprising a memory cell array including a plurality of memory cells coupled to a plurality of word-lines and a plurality of bit-lines, and a control logic circuit to control access to the memory cell array, a command from a memory controller is received by the control logic circuit to perform an internal processing operation on a first set of data stored in the memory cell array, the internal processing operation is performed on the first set of data, by an internal processing circuit of the semiconductor memory device, to provide a processing result data to an error correction circuit, a parity data is generated by the error correction circuit based on the processing result data, the processing result data and the parity data are stored in a target page of the memory cell array and processing result data and the parity data are transmitted to the memory controller.

According to exemplary embodiments, a semiconductor memory device includes memory cell array, an error correction circuit, and an internal processing circuit. The error correction circuit is configured to generate a corrected data by performing an error correction on a read data from the memory cell array, the read data including a first main data and a first parity data. The internal processing circuit is configured to generate a first processed data by performing an internal processing on the corrected data including a second main data and a second parity data. The error correction circuit is further configured to generate a third parity data by performing an error correction on the first processed data, and store the third parity data and the first processed data in the memory cell array.

Accordingly, the semiconductor memory device according to exemplary embodiments supports in-memory processing and may greatly reduce transmission through memory-controller interface. Therefore, exemplary embodiments may save memory bandwidth and increase usability of the semiconductor memory device by generating a second parity data using the same ECC of the ECCs as a first ECC in the memory controller.

BRIEF DESCRIPTION OF THE DRAWINGS

Exemplary embodiments will be described below in more detail with reference to the accompanying drawings.

FIG. 3 is a block diagram illustrating the semiconductor memory device shown in FIG. 2, according to exemplary embodiments.

DETAILED DESCRIPTION

Various exemplary embodiments will be described more fully hereinafter with reference to the accompanying drawings, in which some exemplary embodiments are shown.

It will be understood that, although the terms first, second, third etc. may be used herein to describe various elements, these elements should not be limited by these terms. Unless indicated otherwise, these terms are generally used to distinguish one element from another. Thus, a first element discussed below in one section of the specification could be termed a second element in a different section of the specification without departing from the teachings of the present disclosure. Also, terms such as "first" and "second" may be used in the claims to name an element of the claim, even thought that particular name is not used to describe in connection with the element in the specification. As used herein, the term "and/or" includes any and all combinations of one or more of the associated listed items. Expressions such as "at least one of," when preceding a list of elements, modify the entire list of elements and do not modify the individual elements of the list.

Figure 1:
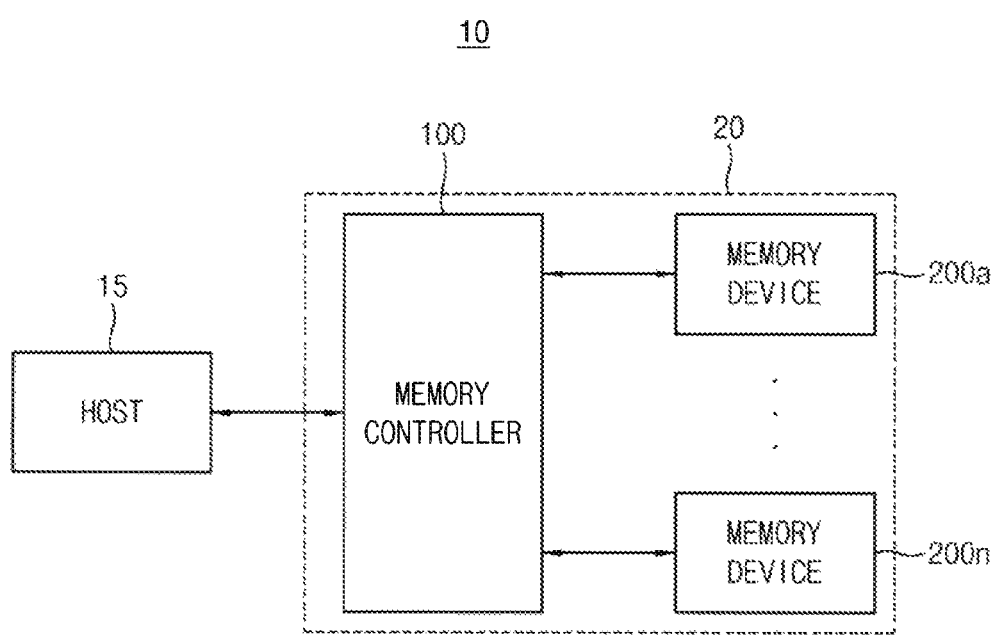
FIG. 1 is a block diagram illustrating an electronic system according to exemplary embodiments.

FIG. 1 is a block diagram illustrating an electronic system according to exemplary embodiments.

As used herein, a semiconductor memory device or a memory device may refer, for example, to a device such as a semiconductor chip (e.g., memory chip and/or logic chip formed from a wafer), a stack of semiconductor chips, a semiconductor package including one or more semiconductor chips stacked on a package substrate, or a package-on-package device including a plurality of packages.

An electronic system, as used herein, may refer to one of these devices and may also include products that include these devices, such as a memory card, a memory module, a hard drive including additional components, a mobile phone, laptop, tablet, desktop, camera, server, computing system, or other consumer electronic device, etc.

Referring to FIG. 1, an electronic system 10 may include a host 15 and a memory system 20. The memory system 20 may include a memory controller 100 and a plurality of semiconductor memory devices 200a~200n (n is an integer greater than two).

The host 15 may communicate with the memory system 20 through various interface protocols such as Peripheral Component Interconnect-Express (PCI-E), Advanced Technology Attachment (ATA), Serial ATA (SATA), Parallel ATA (PATA), or serial attached SCSI (SAS). In addition, the host 15 may also communicate with the memory system 20 through interface protocols such as Universal Serial Bus (USB), Multi-Media Card (MMC), Enhanced Small Disk Interface (ESDI), or Integrated Drive Electronics (IDE).

The memory controller 100 may control an overall operation of the memory system 20. The memory controller 100 may control an overall data exchange between the host 15 and the plurality of semiconductor memory devices 200a~200n. For example, the memory controller 100 may write data in the plurality of semiconductor memory devices 200a~200n or read data from the plurality of semiconductor memory devices 200a~200n in response to request from the host 15.

In addition, the memory controller 100 may issue operation commands to the plurality of semiconductor memory devices 200a~200n for controlling the plurality of semiconductor memory devices 200a~200n.

In some embodiments, each of the plurality of semiconductor memory devices 200a~200n may be a may be a memory device including resistive type memory cells such as a magnetoresistive random access memory (MRAM), a resistive random access memory (RRAM), a phase change random access memory (PRAM) and a ferroelectric random access memory (FRAM), etc. In other exemplary embodiments, each of the plurality of semiconductor memory devices 200a~200n may be a memory device including dynamic memory cells such as a dynamic random access memory (DRAM).

An MRAM is a nonvolatile memory device based on magnetoresistance. An MRAM is different from a volatile RAM in many aspects. For example, since an MRAM is nonvolatile, the MRAM may retain all stored data even when power is turned off.

Although a nonvolatile RAM is generally slower than a volatile RAM, an MRAM has read and write response times comparable with read and write response times of a volatile RAM. Unlike a conventional RAM that stores data as electric charge, an MRAM stores data by using magnetoresistance (or magnetoresistive) elements. In general, a magnetoresistance element is made of two magnetic layers, each having a magnetization.

Figure 2:
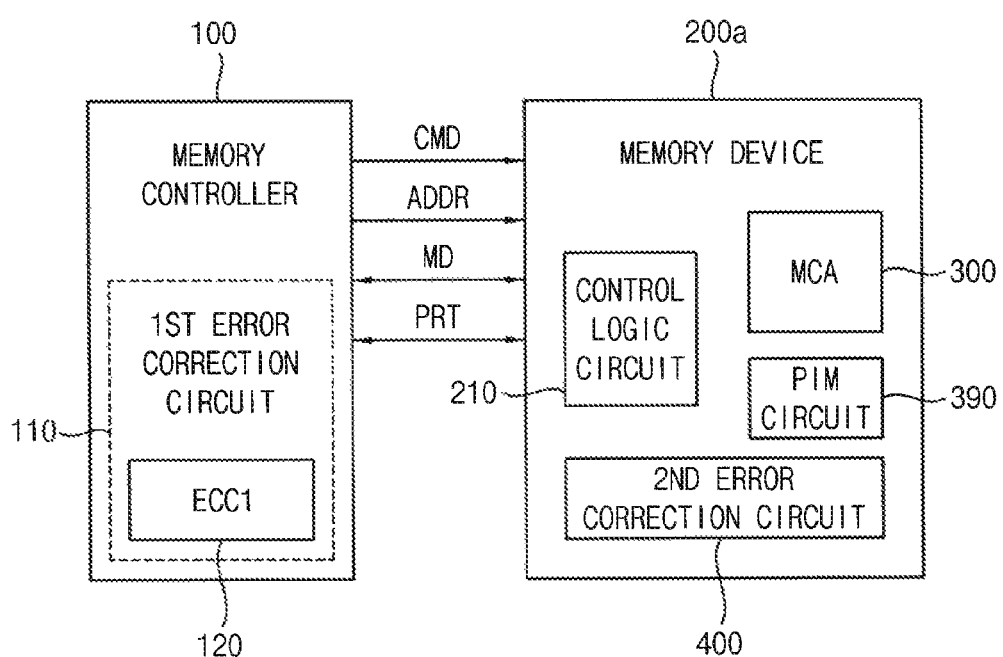
FIG. 2 is a block diagram illustrating the memory system shown in FIG. 1 according to example embodiments.

FIG. 2 is a block diagram illustrating the memory system shown in FIG. 1 according to example embodiments.

In FIG. 2, only one semiconductor memory device 200a in communication with the memory controller 100 is illustrated for convenience. However, the details discussed herein related to semiconductor memory device 200a may equally apply to the other semiconductor memory devices 200b~200n.

Referring to FIG. 2, the memory system 20 may include the memory controller 100 and the semiconductor memory device 200a. The memory controller 20 transmits a command CMD and an address ADDR to the semiconductor memory device 200a. The memory controller 20 exchanges a main data MD and a parity data PRT with the semiconductor memory device 200a through a main data line and a parity data line. In one example embodiment, the main data MD and the parity data PRT may be transmitted through a common data line (e.g., DQ). The parity data PRT may be generated based on the main data MD and may be used for correcting errors of the main data MD.

When the memory controller 100 transmits the main data MD to the semiconductor memory device 200a, a first error correction circuit 110 in the memory controller 100 may generate the parity data PRT using a first error correction code (ECC1) 120. The first error correction code 120 may be at least one of a single error correction (SEC) code, a single error correction and double error detection (SECDED) code, and double error correction (DEC) code.

The semiconductor memory device 200a may include a memory cell array 300 in which the main data MD and the parity data PRT are stored and a control logic circuit 210 which controls an access to the memory cell array 300. The semiconductor memory device 200a may further include an internal processing circuit (the internal processing circuit may be also referred to as a processing in-memory circuit (PIMC)) 390 and a second error correction circuit 400. The internal processing circuit 390 may be selectively enabled when the command CMD directs an internal processing operation, and the internal processing circuit 390 performs an internal processing on a first set of data (hereinafter, may be referred to as a bit vector) stored in the memory cell array 300 to generate an processing result data indicating a result of the internal processing operation. The first set of data stored in the memory cell array 300 may be data of at least one page or at least one block of the memory cell array 300. The second error correction circuit 400 performs an ECC encoding on the processing result data to generate a second parity data and stores the processing result data and the second parity data in a target page of the memory cell array 300.

The second error correction circuit 400 may generate the second parity data by selecting the same ECC of a plurality of ECCs stored therein as the ECC which the first error correction circuit 110 uses when generating the parity data PRT.

FIG. 3 is a block diagram illustrating the semiconductor memory device in FIG. 2 according to exemplary embodiments.

Referring to FIG. 3, the semiconductor memory device 200a may include a control logic circuit 210, an address register 220, a bank control logic 230, a refresh counter 297, a row address multiplexer 240, a column address latch 250, a row decoder 260, a column decoder 270, a memory cell array 300, a sense amplifier unit 285, an input/output (I/O) gating circuit 290, the internal processing circuit 390, the second error correction circuit 400, a path selection circuit 280, and a data input/output (I/O) buffer 299.

The semiconductor memory device 200a includes the internal processing circuit 390 and supports a processing in-memory (PIM) of pop-count (or pop-counting) operation and a logical bitwise operation on at least one bit-vector. When the semiconductor memory device 200a executes the processing in-memory, the second error correction circuit 400 employing a plurality of ECCs in the semiconductor memory device 200a may perform an ECC encoding using the same ECC as the first ECC 120 of the memory controller 100 although a manufacture of the memory controller 100 varies. The second error correction circuit 400 may be configurable.

In some embodiments, the refresh counter 297 may not be included in the semiconductor memory device 200a.

The memory cell array 300 may include first through eighth bank memory arrays 310~380. The row decoder 260 may include first through eighth bank row decoders 260a~260h respectively coupled to the first through eighth bank memory arrays 310~380, the column decoder 270 may include first through eighth bank column decoders 270a~270h respectively coupled to the first through eighth bank memory arrays 310~380, and the sense amplifier unit 285 may include first through eighth bank sense amplifiers 285a~285h respectively coupled to the first through eighth bank memory arrays 310~380. Each of the first through eighth bank memory arrays 310~380 may include a plurality of memory cells MC, and each of the memory cells MC is coupled to a corresponding word-line WL and a corresponding bit-line BTL. The first through eighth bank memory arrays 310~380, the first through eighth bank row decoders 260a~260h, the first through eighth bank column decoders 270a~270h and first through eighth bank sense amplifiers 285a~285h may form first through eighth banks. Although the semiconductor memory device 200a shown in FIG. 3 illustrates eighth banks, the semiconductor memory device 200a may include other number of banks.

The address register 220 may receive an address ADDR including a bank address BANK_ADDR, a row address ROW_ADDR and a column address COL_ADDR from the memory controller 100. The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. One of the first through eighth bank row decoders 260a~260h corresponding to the bank address BANK_ADDR may be activated in response to the bank control signals, and one of the first through eighth bank column decoders 270a~270h corresponding to the bank address BANK_ADDR may be activated in response to the bank control signals.

The refresh counter 297 may generate a refresh row address REF_ADDR for refreshing memory cell rows in the memory cell array 300 under control of the control logic circuit 210. The refresh counter 297 may be included when the memory cells MC are implemented with dynamic memory cells.

The row address multiplexer 240 may receive the row address ROW_ADDR from the address register 220, and may receive the refresh row address REF_ADDR from the refresh counter 297. The row address multiplexer 240 may selectively output the row address ROW_ADDR or the refresh row address REF_ADDR as a row address RA. The row address RA that is output from the row address multiplexer 240 may be applied to the first through eighth bank row decoders 260a~260h.

The activated one of the first through eighth bank row decoders 260a~260h may decode the row address RA that is output from the row address multiplexer 240, and may activate a word-line corresponding to the row address RA. For example, the activated bank row decoder may apply a word-line driving voltage to the word-line corresponding to the row address RA.

The column address latch 250 may receive the column address COL_ADDR from the address register 220, and may temporarily store the received column address COL_ADDR. In some embodiments, in a burst mode, the column address latch 250 may generate column addresses that increment from the received column address COL_ADDR. The column address latch 250 may apply the temporarily stored or generated column address COL_ADDR to the first through eighth bank column decoders 270a~270h.

The activated one of the first through eighth bank column decoders 270a~270h may decode the column address COL_ADDR that is output from the column address latch 250, and may control the I/O gating circuit 290 in order to output data corresponding to the column address COL_ADDR.

The I/O gating circuit 290 may include a circuitry for gating input/output data. The I/O gating circuit 290 may further include read data latches for storing data that is output from the first through eighth bank memory arrays 310~380, and write drivers for writing data to the first through eighth bank memory arrays 310~380. The I/O gating circuit 290 may include a cross-bar switch to change a memory location in which the main data MD and the parity data are stored in the memory cell array 300.

Data read from one bank memory array of the first through eighth bank memory arrays 310~380 may be sensed by sense amplifiers coupled to the one bank memory array from which the data is to be read, and may be stored in the read data latches. The data stored in the read data latches may be provided to the memory controller 100 selectively via the internal processing circuit 390 and the error correction circuit 400 and through the data I/O buffer 299 according to an internal processing mode. Codeword CW to be written in one bank memory array of the first through eighth bank memory arrays 310~380 may be provided to the data I/O buffer 299 from the memory controller 100.

The data I/O buffer 299 provides a first codeword CW1 to the I/O gating circuit 290 in a write operation and provides a second codeword CW2 from the error correction circuit 400 or the first codeword CW1 from the path selection circuit 280 to the memory controller 100 in a read operation.

The path selection circuit 280 provides the first codeword CW1 to the data I/O buffer 299 in a normal mode and provides the first codeword CW1 to the internal processing circuit 390 in an internal processing mode in response to an internal processing mode signal IPS.

The internal processing circuit 390 is selectively enabled in response to the internal processing mode signal IPS, performs the internal processing on a main data of the first codeword CW1 from the path selection circuit 280 and provides the second error correction circuit 400 with a processing result data indicating a result of the internal processing.

The second error correction circuit 400 performs an ECC encoding on the processing result data to generate a second parity data and stores the second codeword CW2 including the processing result data and the second parity data in a target page through the I/O gating circuit 290 in the internal processing mode, in response to the internal processing mode signal IPS. The second error correction circuit 400 may transmit the second codeword CW2 to the memory controller 100 through the data I/O buffer 299.

The error correction circuit 400, in a write operation of the semiconductor memory device 200a, may generate a parity data based on the main data MD received from the data I/O buffer 299, and may provide the I/O gating circuit 290 with the codeword CW including the main data MD and the parity data. The I/O gating circuit 290 may write the main data MD of the codeword CW in a first sub array and write the parity data of the codeword CW in a second sub array. The first sub array and the second sub array may be belonged to different bank memory arrays.

The control logic circuit 210 may control operations of the semiconductor memory device 200a. For example, the control logic circuit 210 may generate control signals for the semiconductor memory device 200a in order to perform a write operation or a read operation. The control logic circuit 210 may include a command decoder 211 that decodes a command CMD received from the memory controller 100 and a mode register 212 that sets an operation mode of the semiconductor memory device 200a.

For example, the command decoder 211 may generate the control signals corresponding to the command CMD by decoding a write enable signal (/WE), a row address strobe signal (/RAS), a column address strobe signal (/CAS), a chip select signal (/CS), etc. The control logic circuit 210 may generate a first control signal CTL1 to control the I/O gating circuit 290 and a second control signal CTL2 to control the second error correction circuit 400. When the mode register 212 is set to the internal operation mode in response to the command CMD, the mode register 212 outputs the internal processing mode signal IPS with a first logic level. The control logic circuit 210 may provide the internal processing mode signal IPS to the path selection circuit 280 and the internal processing circuit 390.

FIGS. 4A to 4E are circuit diagrams of examples of a memory cell shown in FIG. 3, according to exemplary embodiments.

Figure 4A:
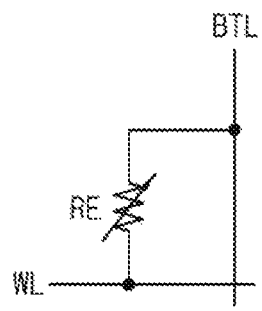
FIGS. 4A to 4E are circuit diagrams of examples of a memory cell shown in FIG. 3, according to exemplary embodiments.
Figure 4B:
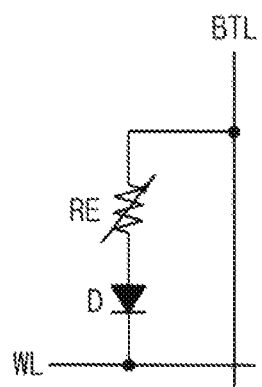
Figure 4C:
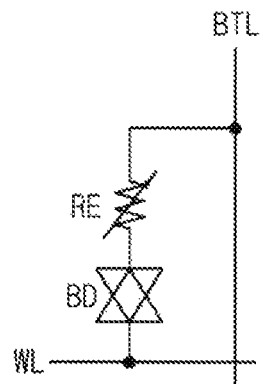
Figure 4D:
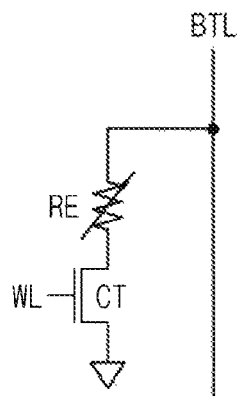
Figure 4E:
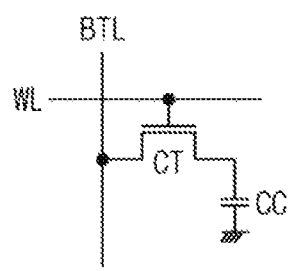

FIGS. 4A to 4D illustrate memory cells MC which are implemented with resistive type memory cells and FIG. 4E illustrates a memory cell MC which is implemented with a dynamic memory cell.

FIG. 4A illustrates a resistive type memory cell without a selection element, while FIGS. 4B to 4D show resistive type memory cells each comprising a selection element.

Referring to FIG. 4A, a memory cell MC may include a resistive element RE connected to a bit-line BTL and a word-line WL. Such a resistive memory cell having a structure without a selection element may store data by a voltage applied between bit-line BL and word-line WL.

Referring to FIG. 4B, a memory cell MC may include a resistive element RE and a diode D. The resistive element RE may include a resistive material for data storage. The diode D may be a selection element (or switching element) that supplies current to resistive element RE or cuts off the current supply to resistive element RE according to a bias of word-line WL and bit-line BTL. The diode D may be coupled between the resistive element RE and word-line WL, and the resistive element RE may be coupled between the bit-line BTL and the diode D. Positions of the diode D and the resistive element RE may be interchangeable. The diode D may be turned on or turned off by a word-line voltage. Thus, a resistive memory cell may be not driven where a voltage of a constant level or higher is supplied to an unselected word-line WL.

Referring to FIG. 4C, a memory cell MC may include a resistive element RE and a bidirectional diode BD. The resistive element R may include a resistive material for data storage. The bidirectional diode BD may be coupled between the resistive element RE and a word-line WL, and the resistive element RE may be coupled between a bit-line BTL and bidirectional diode BD. Positions of the bidirectional diode BD and the resistive element RE may be interchangeable. The bidirectional diode BD may block leakage current flowing to an unselected semiconductor memory cell.

Referring to FIG. 4D, a memory cell MC may include a resistive element RE and a transistor CT. The transistor CT may be a selection element (or switching element) that supplies current to the resistive element RE or cuts off the current supply to the resistive element RE according to a voltage of a word-line WL. The transistor CT may be coupled between the resistive element RE and a word-line WL, and the resistive element RE may be coupled between a bit-line BTL and the transistor CT. Positions of the transistor CT and the resistive element RE may be interchangeable. The semiconductor memory cell may be selected or unselected depending on whether the transistor CT drive by word-line WL is turned on or turned off.

Referring to FIG. 4E, a memory cell MC may include a cell capacitor CC and a transistor CT. The transistor CT may be a selection element (or switching element) that connects/disconnects the cell capacitor CC to/from bit-line BTL according to a voltage of a word-line WL. The transistor CT may be coupled between the cell capacitor CC, a word-line WL and a bit-line BTL, and the cell capacitor CC may be coupled between the transistor CT and a plate voltage (not illustrated).

Figure 5:
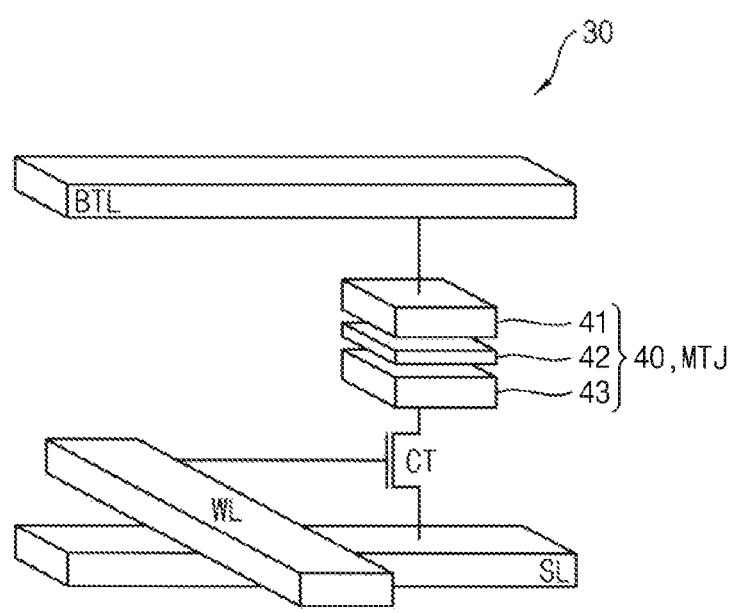
FIG. 5 illustrates an example of a memory cell (referred to as STT-MRAM cell) shown in FIG. 3, according to exemplary embodiments.

FIG. 5 illustrates an example of a memory cell (referred to as STT-MRAM cell) shown in FIG. 3, according to exemplary embodiments.

Referring to FIG. 5, an STT-MRAM cell 30 may include a MTJ element 40 and a cell transistor CT. A gate of the cell transistor CT is connected to a word-line WL and one electrode of the cell transistor CT is connected through the MTJ 40 to a bit-line BTL. Also, the other electrode of the cell transistor CT is connected to a source line SL.

The MTJ element 40 may include the free layer 41, the pinned layer 43, and a tunnel layer 42 disposed between the free layer 41 and the pinned layer 43. A magnetization direction of the pinned layer 43 may be fixed, and a magnetization direction of the free layer 41 may be parallel to or anti-parallel to the magnetization direction of the pinned layer 43 according to written data. In order to fix the magnetization direction of the pinned layer 43, for example, an anti-ferromagnetic layer (not shown) may be further provided.

In order to perform a write operation of the STT-MRAM cell 30, a logic high voltage is applied to the word-line WL to turn on the cell transistor CT. A program current, for example, a write current is applied to the bit-line BL and the source line SL. A direction of the write current is determined by a logic state of the MTJ element 40.

In order to perform a read operation of the STT-MRAM cell 30, a logic high voltage is applied to the word-line WL to turn on the cell transistor CT, and a read current is supplied to the bit-line BL and the source line SL. Accordingly, a voltage is developed at both ends of the MTJ element 40, is detected by the sense amplifier 285a, and is compared with a reference voltage from a reference voltage to determine a logic state of the MTJ element 40. Accordingly, data stored in the MTJ element 40 may be detected.

Figure 6A:
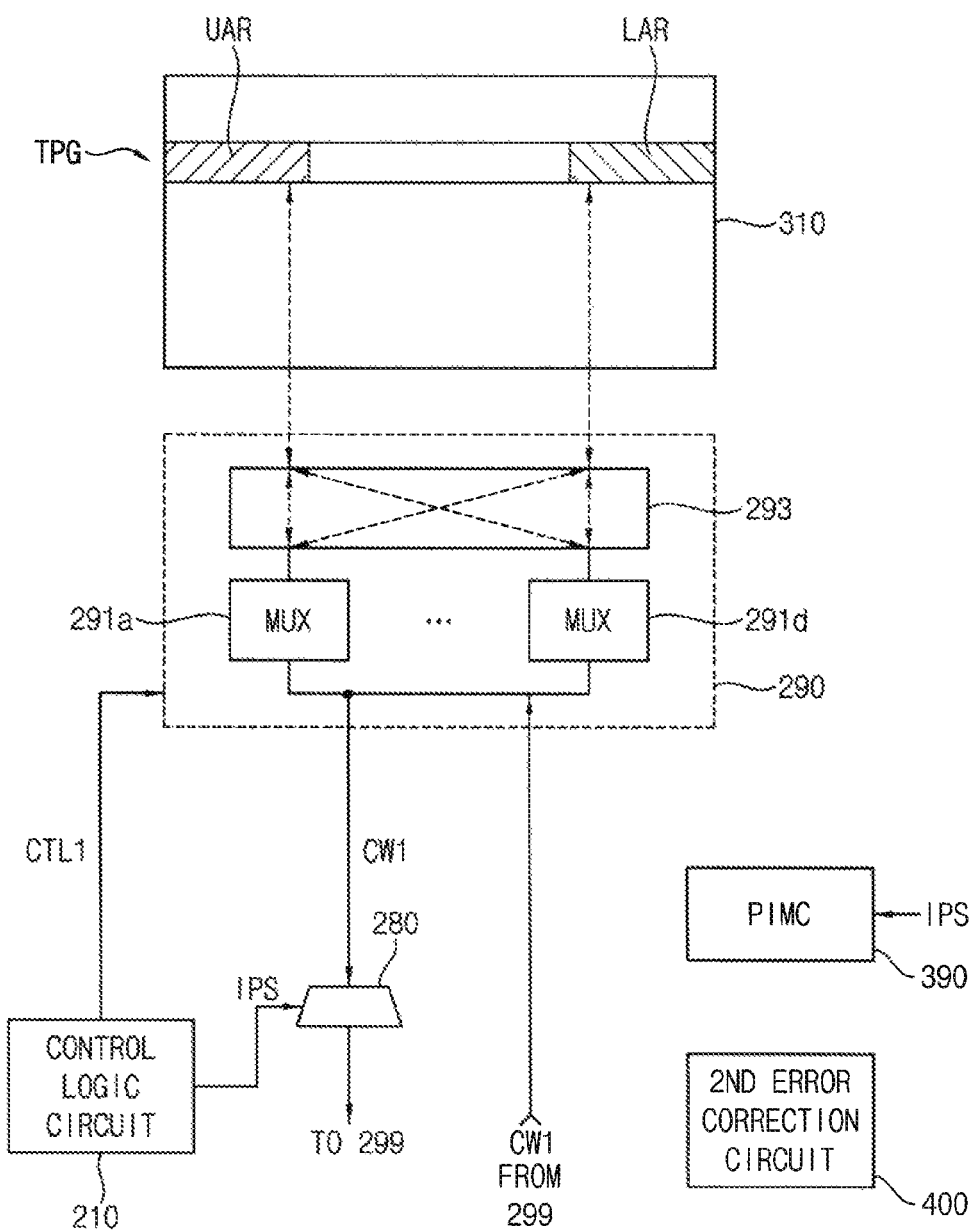
FIG. 6A illustrates a portion of the semiconductor memory device of FIG. 3 in a non-internal processing mode (a normal mode) according to exemplary embodiments.

FIG. 6A illustrates a portion of the semiconductor memory device of FIG. 3 in a non-internal processing mode (a normal mode) according to exemplary embodiments.

In FIG. 6A, the control logic circuit 210, the first bank memory array 310, the I/O gating circuit 290, the path selection circuit 280, the internal processing circuit 390, and the error correction circuit 400 are illustrated.

Referring to FIG. 6A, the internal processing mode signal IPS may have a second logic level (low level) in the normal mode and the internal processing circuit 390 is disabled. The first bank memory array 310 includes a plurality of memory cells coupled to a plurality of word-lines and a plurality of bit-lines, and each of the memory cells include a dynamic memory cell or a resistive type memory cell.

The I/O gating circuit 290 includes a cross-bar switch 293 coupled between the first bank memory array 310 and a plurality of switching circuits 291a~291d. The plurality of switching circuits 291a~291d may be coupled to the path selection circuit 280 and the data I/O buffer 299. In the semiconductor memory device 200a, bit lines corresponding to data of a burst length (BL) may be simultaneously accessed to support the BL indicating the maximum number of column positions that is accessible. For example, if the BL is set to 8, data bits may be set to 128 bits.

In a write operation of the normal mode, the data I/O buffer 299 provides the first codeword CW1 to the switching circuits 291a~291d. The switching circuits 291a~291d may provide the first codeword CW1 to the cross-bar switch 293 in response to a first control signal CTL1 from the control logic circuit 210. The cross-bar switch 293 may transfer a first codeword CW1 to a target page TPG in the first bank memory array 310 in response to the first control signal CTL1. When the cross-bar switch 293 transfers the first codeword CW1 to the target page TPG in the first bank memory array 310, the cross-bar switch 293 may transfer a first parity data in the first codeword CW1 to an upper address region (i.e., a location corresponding to an upper address) UAR or to a lower address region (i.e., a location corresponding to a lower address) LAR of the target page TPG. The first parity data of the first codeword CW1 may transfer to the upper address region UAR or to the lower address region LAR of the target page TPG in response to the first control signal CTL1.

When the cross-bar switch 293 transfers the first parity data of the first codeword CW1 to the upper address region UAR of the target page TPG, a first main data of the first codeword CW1 may be stored in a remaining region (or memory location) of the target page TPG except the upper address region UAR. When the cross-bar switch 293 transfers the first parity data of the first codeword CW1 to the lower address region LAR of the target page TPG, the first main data of the first codeword CW1 may be stored in a remaining region of the target page TPG except the lower address region LAR.

In a read operation of the normal mode, the first codeword CW1 from the target page TPG of the first bank memory array 310 is provided to the path selection circuit 280 through the I/O gating circuit 290. The path selection circuit 280 provides the first codeword CW1 to the data I/O buffer 299 in response to the internal processing mode signal IPS.

Figure 6B:
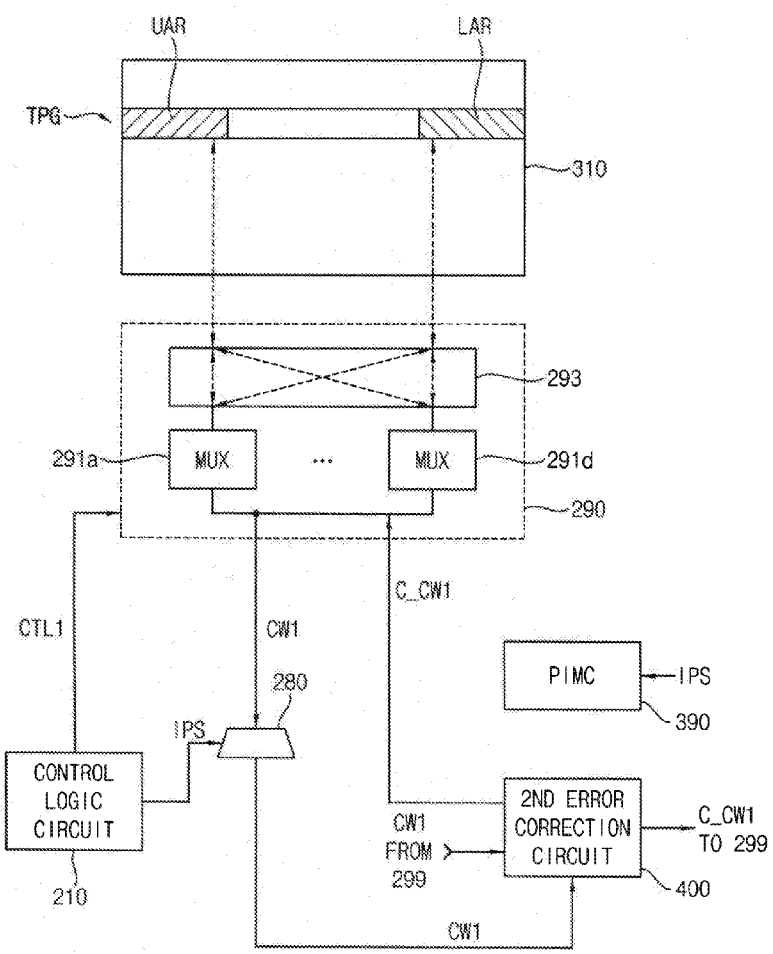
FIG. 6B illustrates a portion of the semiconductor memory device of FIG. 3 in a non-internal processing mode (a normal mode) according to other exemplary embodiments.

FIG. 6B illustrates a portion of the semiconductor memory device of FIG. 3 in a non-internal processing mode (e.g., a normal mode) according to other exemplary embodiments.

In the present embodiment, the same descriptions as described in the aforementioned embodiments will be omitted or mentioned briefly for the purpose of ease and convenience in explanation. Hereinafter, the components described with reference to FIG. 6A will be not described again.

Referring to FIG. 6B, in a write operation of the normal mode, the data I/O buffer 299 provides a first codeword CW1 to the second error correction circuit 400. The first codeword CW1 may include a first main data and a first parity data. The second error correction circuit 400 may perform an error correction on the first codeword CW1 and generate a corrected codeword C_CW1 including a second main data and a second parity data, and provide corrected codeword C_CW1 to the I/O gating circuit 290. The switching circuits 291a~291d may provide the corrected codeword C_CW1 to the cross-bar switch 293 in response to the first control signal CTL1. When an error has not occurred after the second error correction circuit 400 performed the error correction, data of the first codeword CW1 and the corrected codeword C_CW1 may be the same as each other.

When the cross-bar switch 293 transfers the second parity data of the corrected codeword C_CW1 to the upper address region UAR of a target page TPG, the second main data of the corrected codeword C_CW1 may be stored in a remaining region of the target page TPG (e.g., the target page portion not including the upper address region UAR). When the cross-bar switch 293 transfers the second parity data of the corrected codeword C_CW1 to the lower address region LAR of the target page TPG, the second main data of the corrected codeword C_CW1 may be stored in a remaining region of the target page TPG (e.g., the target page portion not including the lower address region LAR).

In a read operation of the internal processing mode in FIG. 6B, the I/O gating circuit 290 provides a first codeword CW1 including a first main data and a first parity data stored in the target page TPG to the second error correction circuit 400. The second error correction circuit 400 may perform an error correction on the first codeword CW1 to generate a corrected codeword C_CW1 including a second main data and a second parity data, and provide to the data I/O buffer 299. The corrected codeword C_CW1 may be stored in the target page TPG through the I/O gating circuit 290.

Figure 7A:
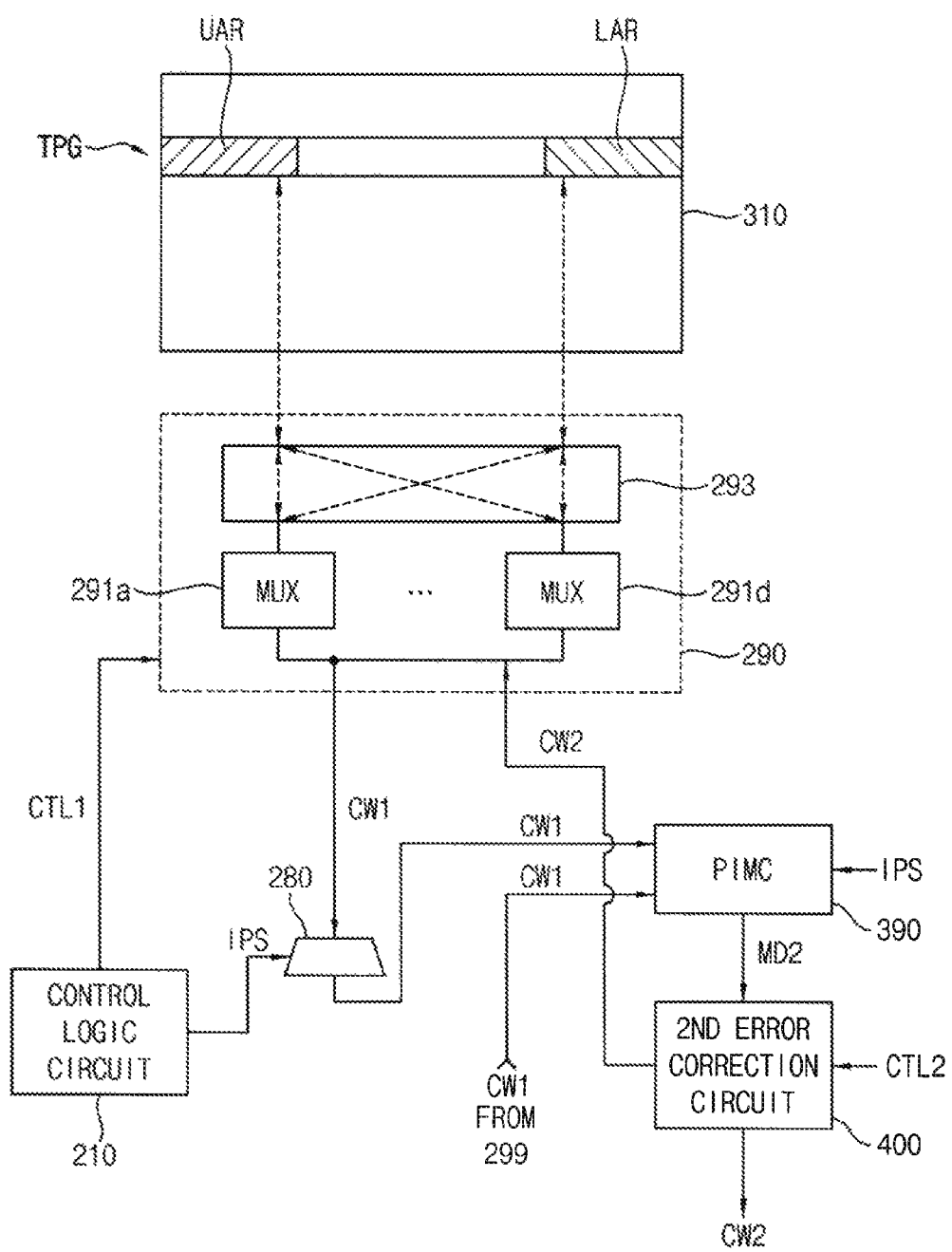
FIG. 7A illustrates a portion of the semiconductor memory device of FIG. 3 in an internal processing mode according to exemplary embodiments.

FIG. 7A illustrates a portion of the semiconductor memory device of FIG. 3 in an internal processing mode according to exemplary embodiments.

In the present embodiment, the same descriptions as described in the aforementioned embodiments will be omitted or mentioned briefly for the purpose of ease and convenience in explanation. Hereinafter, the components described with reference to FIG. 6A will be not described again.

Referring to FIG. 7A, the internal processing mode signal IPS may have a first logic level (high level) in the internal processing mode and the internal processing circuit 390 is enabled.

In a write operation of the internal processing mode in FIG. 7A, the data I/O buffer 299 provides a first codeword CW1 to the internal processing circuit 390. The internal processing circuit 390 may perform an internal processing on a first main data of the first codeword CW1 and output a processing result data MD2 to the second error correction circuit 400. The internal processing circuit 390 may perform an increment operation that changes the first main data of the first codeword CW1 in increments of 1 and generates a processing result data MD2. The second error correction circuit 400 may perform an ECC encoding on the processing result data MD2 to generate a second parity data and provides the second codeword CW2 including the processing result data MD2 and the second parity data to the I/O gating circuit 290. The switching circuits 291a~291d may provide the second codeword CW2 to the cross-bar switch 293 in response to a first control signal CTL1 from the control logic circuit 210. The cross-bar switch 293 may transfer the second codeword CW2 to a target page TPG in the first bank memory array 310, in response to the first control signal CTL1. When the cross-bar switch 293 transfers the second codeword CW2 to the target page TPG in the first bank memory array 310, the cross-bar switch 293 may transfer the second parity data in the second codeword CW2 to an upper address region (i.e., a location corresponding to an upper address) UAR or to a lower address region (i.e., a location corresponding to a lower address) LAR of the target page TPG. The second parity data of the second codeword CW2 may be transferred to the upper address region UAR or to the lower address region LAR of the target page TPG in response to the first control signal CTL1.

Figure 16:
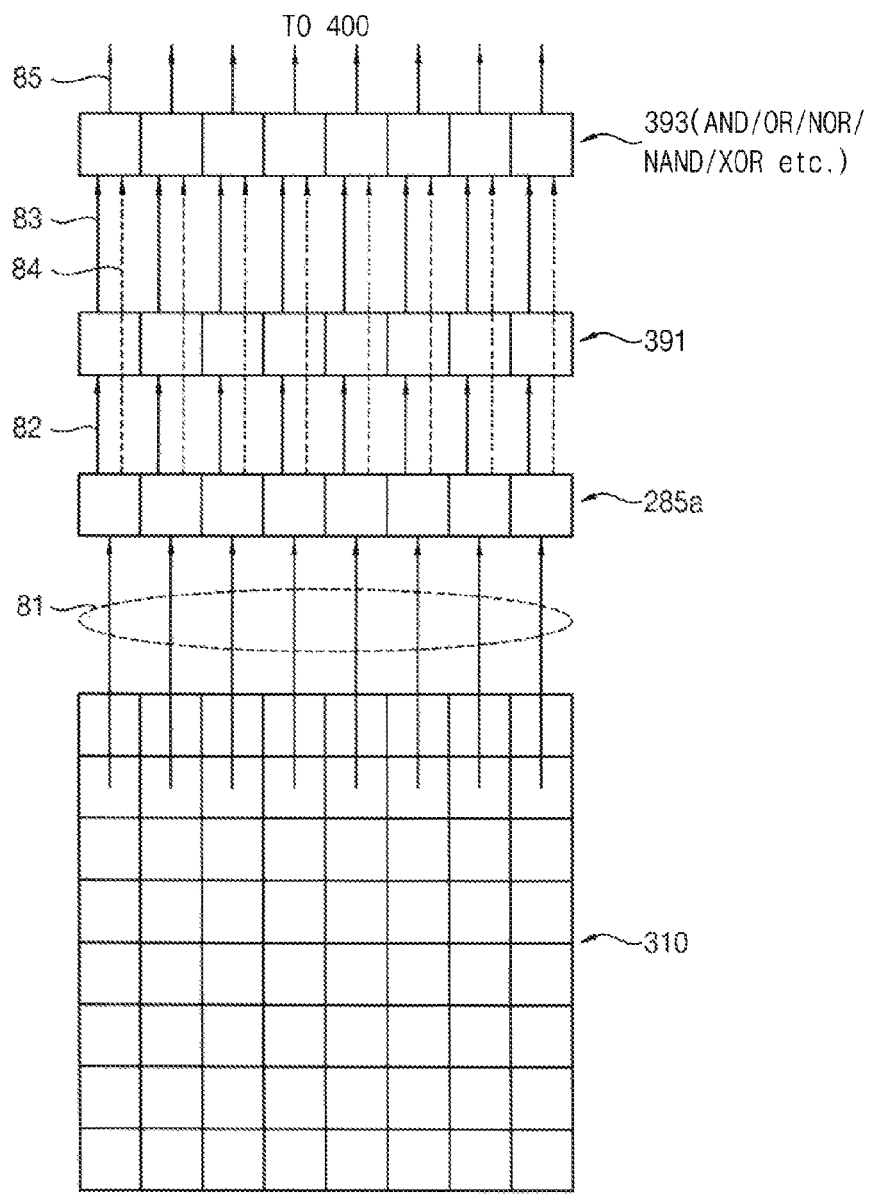
FIG. 16 illustrates that a logical bitwise operation is performed in the semiconductor memory device of FIG. 3 according to exemplary embodiments.

In a read operation in the internal processing mode, the I/O gating circuit 290 provides a first codeword CW1 stored in the target page TPG to the path selection circuit 280, and the path selection circuit 280 provides the first codeword CW1 to the internal processing circuit 390 in response to the internal processing mode signal IPS. The internal processing circuit 390 is enabled in response to the internal processing mode signal IPS, performs an internal processing on a first main data of the first codeword CW1 and outputs a processing result data MD2 to the second error correction circuit 400. The internal processing circuit 390 may include at least one buffer 391 and at least one processing block 393 as illustrated in FIG. 16.

The second error correction circuit 400 performs an ECC encoding on the processing result data MD2 to generate a second parity data and provides the second codeword CW2 including the processing result data MD2 and the second parity data to the I/O gating circuit 290 and the data I/O buffer 299.

Figure 7B:
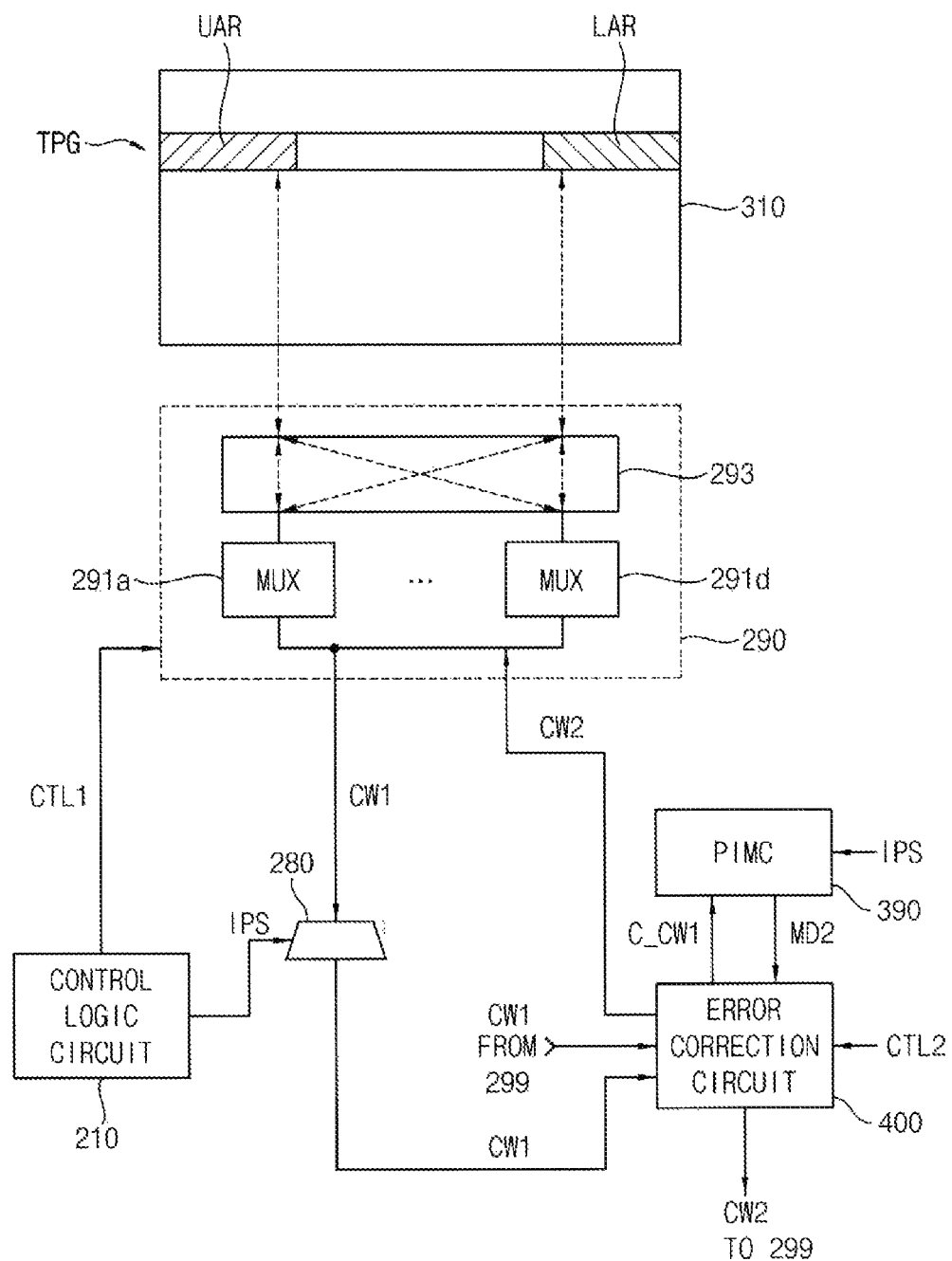
FIG. 7B illustrates a portion of the semiconductor memory device of FIG. 3 in an internal processing mode according to other exemplary embodiments.

FIG. 7B illustrates a portion of the semiconductor memory device of FIG. 3 in an internal processing mode according to other exemplary embodiments.

In the present embodiment, the same descriptions as described in the aforementioned embodiments will be omitted or mentioned briefly for the purpose of ease and convenience in explanation. Hereinafter, the components described with reference to FIG. 7A will be not described again.

Referring to FIG. 7B, in a write operation of the internal processing mode, the data I/O buffer 299 provides a first codeword CW1 to the second error correction circuit 400. The second error correction circuit 400 may perform an ECC decoding on the first codeword CW1 and provide a corrected codeword C_CW1 to the internal processing circuit 390. The internal processing circuit 390 may perform an internal processing on a first main data of the corrected codeword C_CW1 and output a processing result data MD2 to the second error correction circuit 400. The internal processing circuit 390 may perform an increment operation that changes the first main data of the corrected codeword C_CW1 in increments of 1. The second error correction circuit 400 may perform an ECC encoding on the processing result data MD2 to generate a second parity data and provide a second codeword CW2 including the processing result data MD2 and the second parity data to the I/O gating circuit 290. The switching circuits 291*a*~291*d* may provide the second codeword CW2 to the cross-bar switch 293. The cross-bar switch 293 may transfer the second codeword CW2 to a target page TPG in the first bank memory array 310. When the cross-bar switch 293 transfers the second codeword CW2 to the target page TPG in the first bank memory array 310, the cross-bar switch 293 may transfer the second parity data in the second codeword CW2 to an upper address region (i.e., a location corresponding to an upper address) UAR or to a lower address region (i.e., a location corresponding to a lower address) LAR of the target page TPG. The second parity data of the second codeword CW2 may be transferred to the upper address region UAR or to the lower address region LAR of the target page TPG in response to the first control signal CTL1.

In a read operation of the internal processing mode in FIG. 7B, the I/O gating circuit 290 provides a first codeword CW1 stored in the target page TPG to the second error correction circuit 400. The second error correction circuit 400 may perform an ECC decoding on the first codeword CW1 and provide a corrected codeword C_CW1 to the internal processing circuit 390. The internal processing circuit 390 may perform an internal processing on a first main data of the corrected codeword C_CW1 and output a processing result data MD2 to the second error correction circuit 400. The second error correction circuit 400 may perform an ECC encoding on the processing result data MD2 to generate a second parity data and provides the second codeword CW2 including the processing result data MD2 and the second parity data to the data I/O buffer 299. The second codeword CW2 may be stored in the target page TPG through the I/O gating circuit 290.

Figure 8:
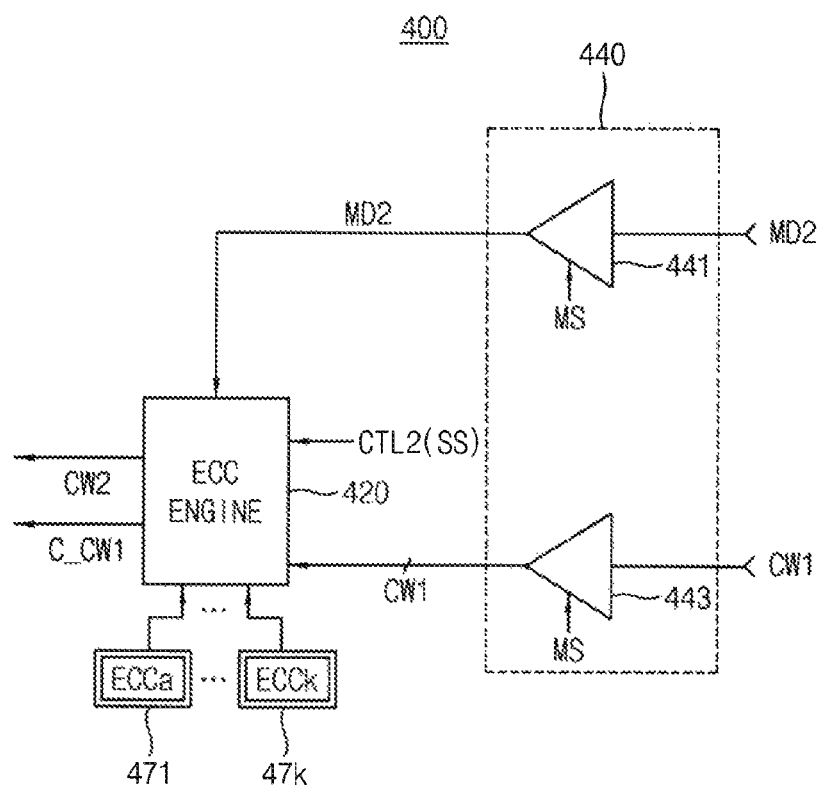
FIG. 8 illustrates the second error correction circuit shown in FIG. 3 according to exemplary embodiments.

FIG. 8 illustrates the second error correction circuit shown in FIG. 3 according to exemplary embodiments.

Referring to FIG. 8, the second error correction circuit 400 may include an ECC engine 420, a buffer unit 440 and a plurality of storage device 471~47*k*. The buffer unit 440 may include first and second buffers 441 and 443.

The first buffer 441 may be enabled in a read operation of the internal processing mode in response to a mode signal MS and provide processing result data MD2 to the ECC engine 420. The second buffer 443 may be enabled in a read operation of the normal mode in response to the mode signal MS, and the second buffer 443 may provide the first codeword CW1 to the ECC engine 420.

The ECC engine 420 may perform an ECC encoding and an ECC decoding by selection the same ECC of a plurality of ECCs stored in the storage devices 471~47*k* as the first ECC 120 in the memory controller 100, in response to a control signal CTL2 from the control logic circuit 210 (e.g., a selection signal SS). The plurality of ECCs stored in the storage devices 471~47*k* may include at least one of a single error correction (SEC) code, a single error correction and double error detection (SECDED) code, and double error correction (DEC) code. The ECC engine 420 performs the ECC encoding on the processing result data MD2 using the same ECC to generate the second parity data and provides the second codeword CW2 including the processing result data MD2 and the second parity data to the data I/O buffer 299 in the read operation of the internal processing mode. The second codeword CW2 may be stored in a target page TPG of the first bank memory array 310 through the I/O gating circuit 290.

In one embodiment, when the first ECC 120 in the memory controller 100 is a single error correction (SEC) code, the memory controller 100 transmits to the control logic circuit 210 an internal processing command including information of the first ECC 120, and the command decoder 211 in the control logic circuit 210 provides the second error correction circuit 400 with the second control signal CTL2 including the selection signal SS that includes the information of the first ECC 120. For example, the ECC engine 420 selects the same ECC ECCa in response to the selection signal SS and performs the ECC encoding.

In one embodiment, when the first ECC 120 in the memory controller 100 is double error correction (DEC) code, the memory controller 100 transmits to the control logic circuit 210 an internal processing command including information of the first ECC 120, and the command decoder 211 in the control logic circuit 210 provides the second error correction circuit 400 with the second control signal CTL2 including the selection signal SS that includes the information of the first ECC 120. For example, ECC engine 420 selects the same ECC ECCb in response to the selection signal SS and performs the ECC encoding.

In one embodiment, when the first ECC 120 in the memory controller 100 is a single error correction and double error detection (SECDED) code, the memory controller 100 transmits to the control logic circuit 210 an internal processing command including information of the first ECC 120, and the command decoder 211 in the control logic circuit 210 provides the second error correction circuit 400 with the second control signal CTL2 including the selection signal SS that includes the information of the first ECC 120. For example, the ECC engine 420 selects the same ECC ECCk in response to the selection signal SS and performs the ECC encoding.

Figure 9:
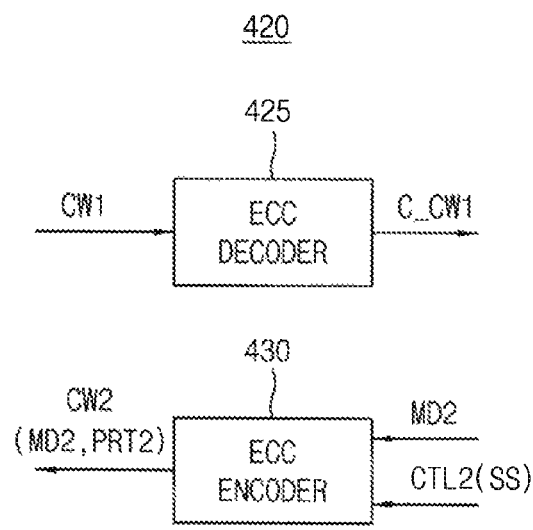
FIG. 9 illustrates an ECC engine in the second error correction circuit of FIG. 8 according to exemplary embodiments.

FIG. 9 illustrates an ECC engine in the second error correction circuit of FIG. 8 according to exemplary embodiments.

Referring to FIG. 9, the ECC engine 420 may include an ECC decoder 425 and an ECC encoder 430.

The ECC decoder 425 performs an ECC decoding on the first codeword CW1 and provides the corrected first codeword C_CW1 to the data I/O buffer 299 in the read operation of the normal mode. The ECC encoder 430 selects the same ECC of the ECCs stored in the storage device 471~47*k* as the first ECC 120 in response to the selection signal SS, performs an ECC encoding on the processing result data MD2 using the same ECC to generate the second parity data PRT2 and the second codeword CW2 including the processing result data MD2 and the second parity data PRT2 to the I/O gating circuit 290 and the data I/O buffer 299 in the read operation of the internal processing mode.

As mentioned above, the semiconductor memory device 200*a* supports in-memory processing and may greatly reduce transmission through memory-controller interface. Therefore, the semiconductor memory device 200*a* may save memory bandwidth and increase usability by generating the second parity data using the same ECC of the ECCs as the first ECC 120 in the memory controller 100.

Figure 10:
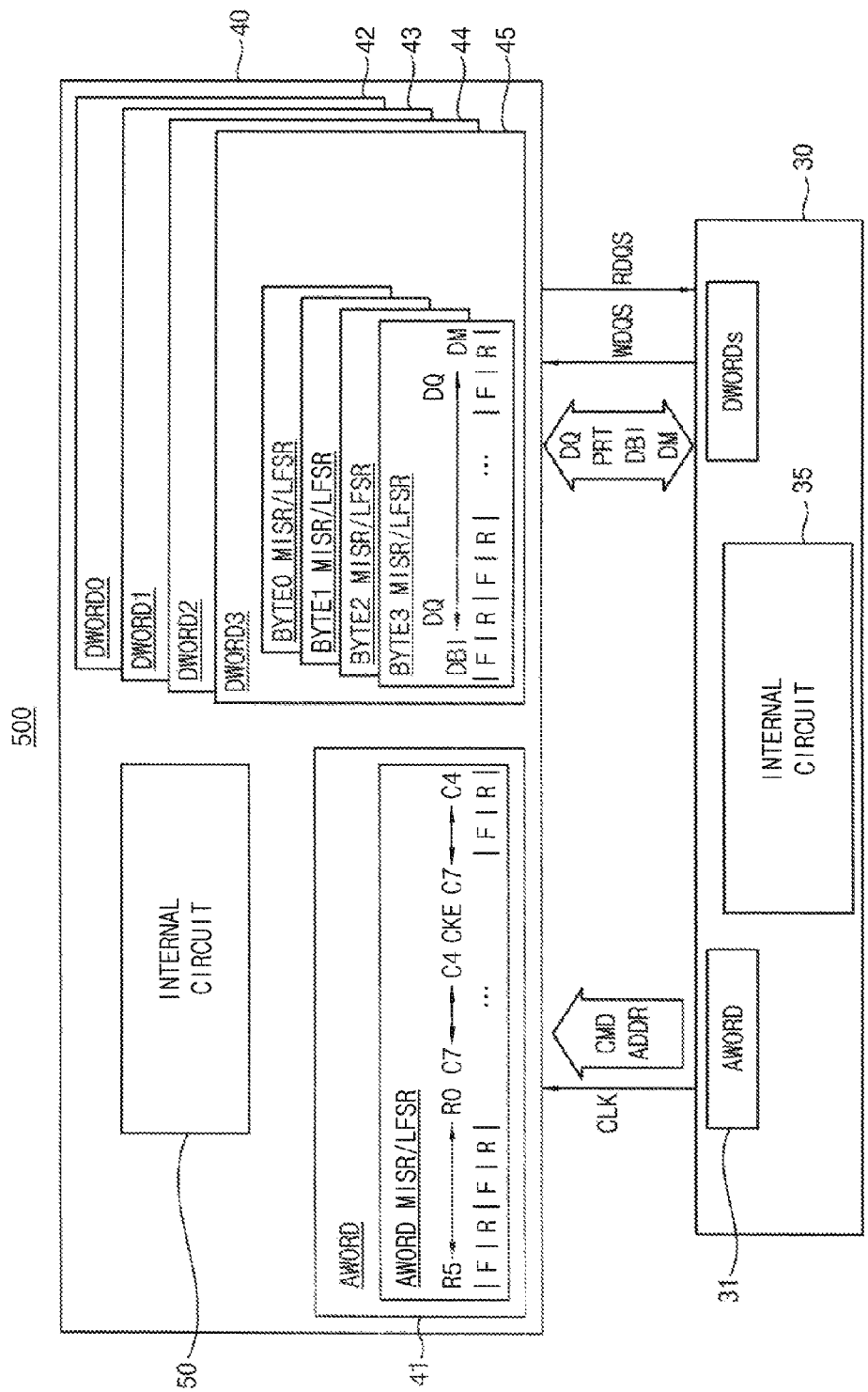
FIG. 10 is a diagram illustrating a memory system according to exemplary embodiments.

FIG. 10 is a diagram illustrating a memory system according to exemplary embodiments.

Referring to FIG. 10, a memory system 500 may include a memory controller 30 and a semiconductor memory device

40. The semiconductor memory device 40 may include a command-address input-output block AWORD 41, data input-output blocks DWORD0~DWORD3 42~45 and an internal circuit 50. The memory controller 30 may include a command-address input-output block 31, data input-output blocks 32 and an internal circuit 35. For example, the semiconductor memory device 40 may be compatible with high bandwidth memory (HBM) standards.

The command CMD, an address ADDR, a system clock signal CLK, a clock enable signal CKE, etc. may be transferred from the command-address input-output block 31 of the memory controller 30 to the command-address input-output block 41 of the semiconductor memory device 40. Data DQ, a data bus inversion signal DBI, a data mask signal DM, a write data strobe signal WDQS, a read data strobe signal RDQS, etc. may be transferred between the data input-output blocks 32 of the memory controller 30 and the data input-output blocks 42~45 of the semiconductor memory device 40.

The multiple-input shift register (MISR) and/or the linear feedback shift register (LFSR) may be implemented in the input-output blocks 41~45 of the semiconductor memory device 40. Using the MISR/LFSR circuits, the links between the memory controller 30 and the semiconductor memory device 40 may be tested and trained.

For example, as illustrated in FIG. 10, the MISR/LFSR circuit corresponding to one byte included in the data input-output blocks 42~45 may have a size of 20 bits. The 20 bits may include rising bits R and falling bits F of the byte data signal, the data bus inversion signal DBI and the data mask signal DM. The MISR/LFSR circuit of the command address input-output block 41 may have a size of 30 bits. The 30 bits may include rising bits R and falling bits F of the row command bits R0~R5, the column command bits C0~C7 and the clock enable signal CKE.

For example, one channel includes four data input-output blocks 42~45 corresponding to four words, and each of the four data input-output blocks 42~45 may include four MISR/LFSR circuits corresponding to four bytes BYTE0~BYTE3.

The semiconductor memory device 40 may be the semiconductor memory device 200a of FIG. 3 and the internal circuit 50 may include the internal processing circuit 390 and the second error correction circuit 400. The internal circuit 35 may include the first error correction circuit 120 as in FIG. 2. Therefore, in the memory system 500, the semiconductor memory device 40 may support in-memory processing and may greatly reduce transmission through memory-controller interface. Therefore, the memory system 500 may save memory bandwidth and increase usability by generating the second parity data using the same ECC of the ECCs as the first ECC 120 in the memory controller 100.

Figure 11:
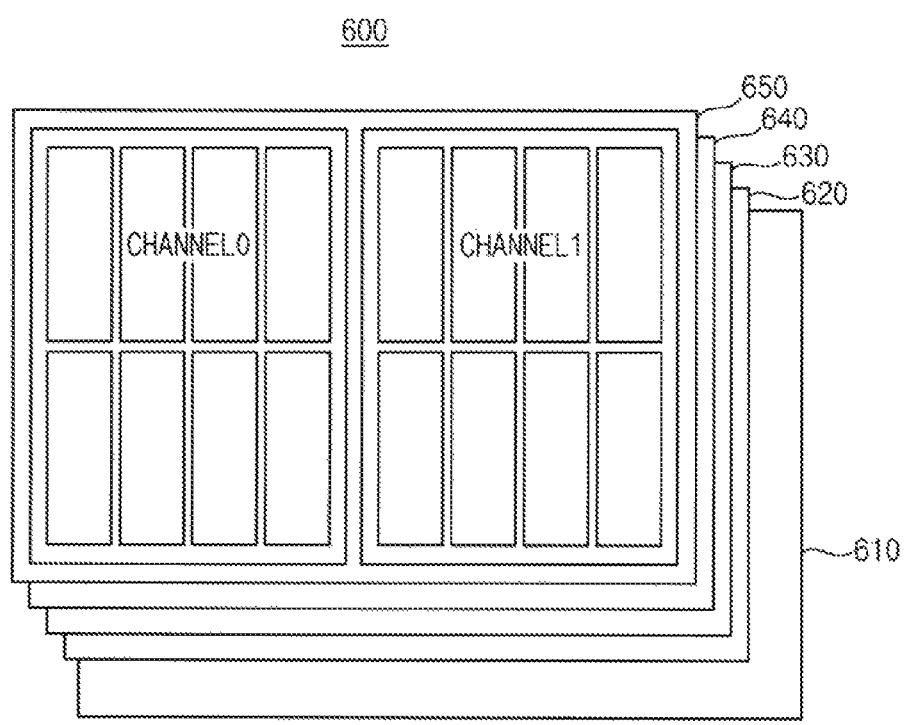
FIG. 11 is a diagram illustrating an example of a high bandwidth memory (HBM) organization.

FIG. 11 is a diagram illustrating an example of a high bandwidth memory (HBM) organization.

Referring to FIG. 11, an HBM 600 may be configured to have a stack of multiple DRAM semiconductor dies 620, 630, 640 and 650. The HBM of the stack structure may be optimized by a plurality of independent interfaces called channels. Each DRAM stack may support up to 8 channels in accordance with the HBM standards. FIG. 11 shows an example stack containing 4 DRAM semiconductor dies 620, 630, 640 and 650, and each DRAM semiconductor die supports two channels CHANNEL0 and CHANNEL1.

Each channel provides access to an independent set of DRAM banks. Requests from one channel may not access data attached to a different channel. Channels are independently clocked, and need not be synchronous.

The HBM 600 may further include an interface die 610 or a logic die disposed at bottom of the stack structure to provide signal routing and other functions. Some function for the DRAM semiconductor dies 620, 630, 640 and 650 may be implemented in the interface die 610. An internal processing circuit and a second error correction circuit described with reference to FIG. 3 may be implemented in the interface die 610, and the processing circuit and the second error correction circuit may perform the internal processing operation and may generate the second parity data.

Figure 12:
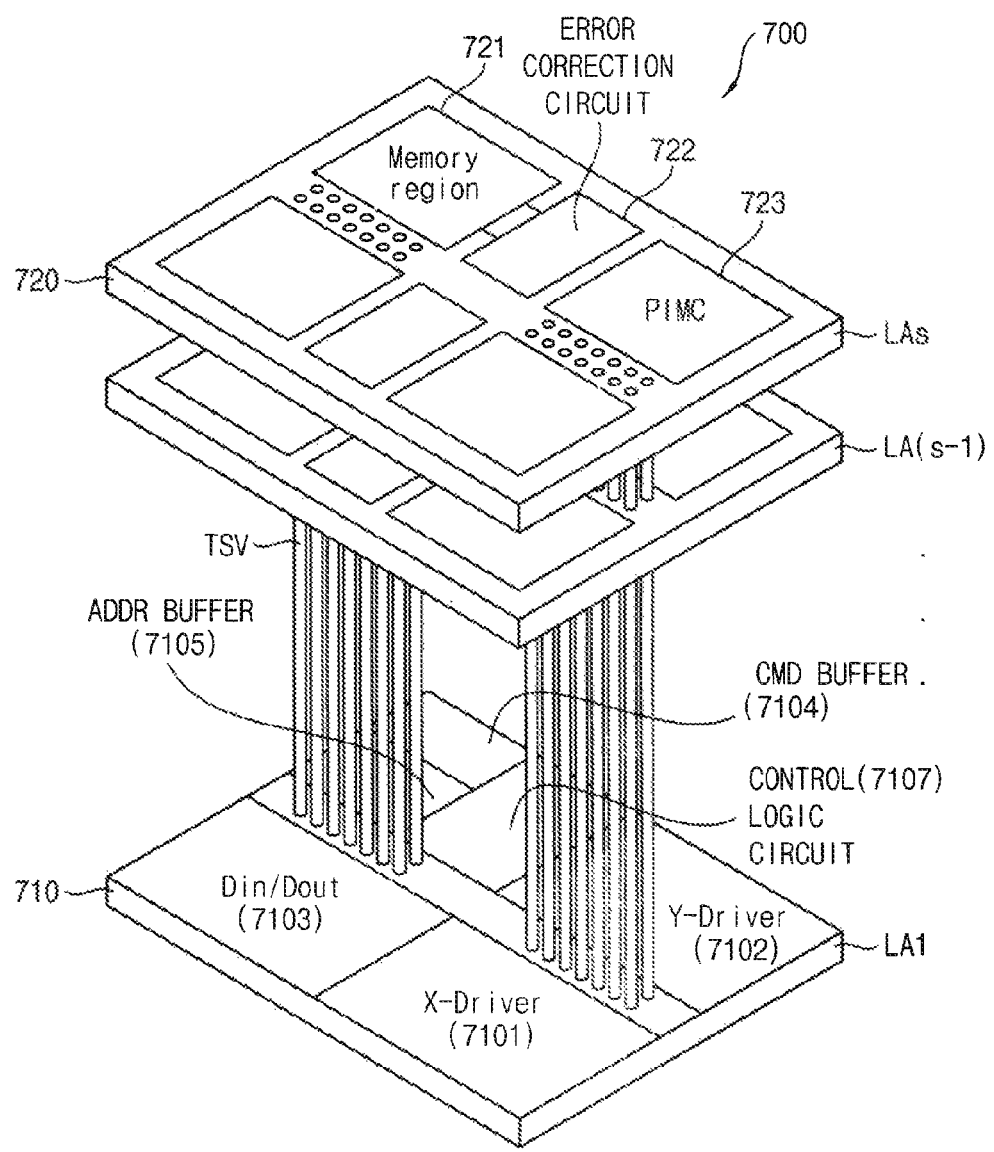
FIG. 12 is a structural diagram illustrating a semiconductor memory device according to exemplary embodiments.

FIG. 12 is a structural diagram illustrating a semiconductor memory device according to exemplary embodiments.

Referring to FIG. 12, a semiconductor memory device 700 may include first through s-th semiconductor integrated circuit layers LA1 through Las (s is an integer equal to or greater than three), in which the lowest first semiconductor integrated circuit layer LA1 is assumed to be an interface or control chip and the other semiconductor integrated circuit layers LA2 through LAs are assumed to be slave chips including core memory chips. The first through s-th semiconductor integrated circuit layers LA1 through LAs may transmit and receive signals therebetween through through-substrate vias (e.g., through-silicon vias) TSVs. The lowest first semiconductor integrated circuit layer LA1 as the interface or control chip may communicate with an external memory controller through a conductive structure formed on an external surface. A description will be made regarding structure and an operation of the semiconductor memory device 700 by mainly using the first semiconductor integrated circuit layer LA1 or 710 as the interface or control chip and the s-th semiconductor integrated circuit layer LAs or 720 as the slave chip.

The first semiconductor integrated circuit layer 710 may include various peripheral circuits for driving memory regions 721 provided in the kth semiconductor integrated circuit layer 720. For example, the first semiconductor integrated circuit layer 710 may include a row (X)-driver 7101 for driving word-lines of a memory, a column (Y)-driver 7102 for driving bit-lines of the memory, a data input/output unit (Din/Dout) 7103 for controlling input/output of data, a command (CMD) buffer 7104 for receiving a command CMD from outside and buffering the command CMD, and an address (ADDR) buffer (or, address register) 7105 for receiving an address from outside and buffering the address. The memory region 721 may include a plurality of bank memory arrays in which a plurality of memory cells are arranged, and each of the plurality of bank memory arrays may include a plurality of bank memory arrays as described with reference to FIG. 3.

The first semiconductor integrated circuit layer 710 may further include a control logic circuit 7107. The control logic circuit 7107 may access the memory region 721 and may generate control signals for accessing the memory region 721 based on the command from the memory controller.

The s-th semiconductor integrated circuit layer 720 may include an internal processing circuit 723 and an error correction circuit 722. The internal processing circuit 723 performs an internal processing on a first codeword stored in the memory region 721 to generate a processing result data when a command designate an internal processing mode. The error correction circuit 722 performs an ECC encoding on the processing result data to generate a second parity data. The error correction circuit 722 may be the same as the error correction circuit 400 disclosed above. The error correction circuit 722 selects the same ECC of a plurality of ECC as an ECC used for generating the first parity data and performs the ECC encoding using the same ECC. Therefore, although when an ECC is changed due to change of a memory controller, the error correction circuit 722 may selects the same ECC an ECC used for generating the first parity data and usability of the semiconductor memory device 700 may be increased.

In addition, a three dimensional (3D) memory array is provided in semiconductor memory device 700. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array. The following patent documents, which are hereby incorporated by reference, describe suitable configurations for the 3D memory arrays, in which the three-dimensional memory array is configured as a plurality of levels, with word-lines and/or bit-lines shared between levels: U.S. Pat. Nos. 7,679,133; 8,553,466; 8,654,587; 8,559,235; and US Pat. Pub. No. 2011/0233648.

Figure 13:
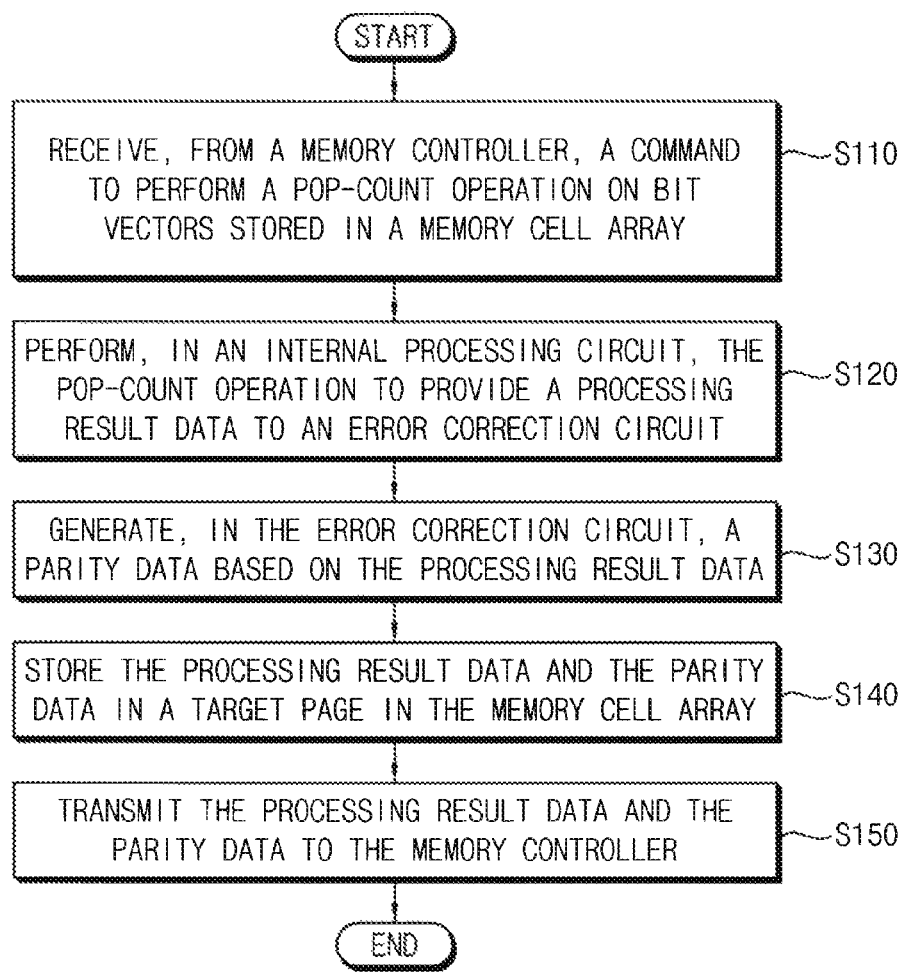
FIG. 13 is a flow chart illustrating a method of operating a semiconductor memory device according to exemplary embodiments.

FIG. 13 is a flow chart illustrating a method of operating a semiconductor memory device according to exemplary embodiments.

Referring to FIGS. 2 through 13, in a method of operating a semiconductor memory device 200a including a memory cell array 300 having a plurality of memory cells coupled to a plurality of word-lines and a plurality of bit-lines and a control logic circuit 210 to control access to the memory cell array 300, the control logic circuit 210 receives a command from a memory controller 100, an internal processing command CMD to perform a pop-count operation on bit vectors (e.g., one or more sets of data) stored in the memory cell array (S110). The semiconductor memory device 200a also receives an address ADDR designating a target page of the memory cell array 300 along with the internal processing command CMD from the memory controller 100.

A row decoder 260 and an I/O gating circuit 290 of the semiconductor memory device 200a provides the internal processing circuit 390 with a bit vector including a main data and a first parity data stored in the target page. The internal processing circuit 390 performs an internal processing corresponding to the command CMD on the main data and provides an error correction circuit 400 with a processing result data corresponding to a result of the internal processing (S120).

The error correction circuit 400 generates a second parity data based on the processing result data (S130). The error correction circuit 400 selects the same ECC of a plurality of ECCs as a first ECC used for generating the first parity data and performs an ECC encoding using the same ECC to generate the second parity data.

The error correction circuit 400 provides the I/O gating circuit 290 with a second codeword including the processing result data and the second parity data to store the processing result data and the second parity in the target page of the memory cell array 300 (S140).

The error correction circuit 400 may transmit the processing result data and the second parity data to the memory controller 100 through the data I/O buffer 299 (S150).

Figure 14:
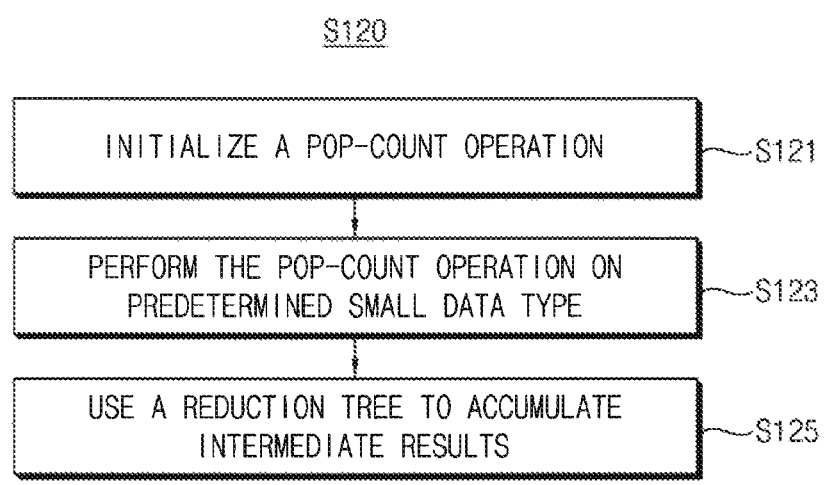
FIG. 14 is a flow chart illustrating in-memory processing of a pop-count operation in a method of FIG. 13 according to exemplary embodiments.

FIG. 14 is a flow chart illustrating in-memory processing of a pop-count operation in a method of FIG. 13 according to exemplary embodiments.

Referring to FIG. 14, for performing the pop-count operation (S120), the internal processing circuit 390 initiates the pop-count operation (S121). Initiating the pop-count operation is performed by resetting registers in the internal processing circuit 390. A pop-count (or population count) operation counts the number of ones (1s) in a bit sequence (or a bit vector).

The internal processing circuit 390 performs pop-counting (on a specified bit vector) over a predefined, small data type such as, for example, on each 8-bit portion of data bits of the main data from the target page (S123). The internal processing circuit 390 may use a reduction tree to accumulate intermediate results and generates the final pop-count (S125).

When executing pop-counts over large vectors that span multiple DRAM pages, the semiconductor memory device 200a may need to know all the page addresses that the vector is stored at. Hence, after the first DRAM page of the vector is processed, the semiconductor memory device 200a may need to figure out the subsequent pages where the vector resides. In one embodiment, a direct memory access (DMA)-like mechanism may be implemented when multiple pages need to be traversed. In such an implementation, the physical addresses of the DRAM pages in which the vector is occupied may be sent to the semiconductor memory device 200a, for example, by the memory controller 100. These pages may be then traversed by an internal controller within the semiconductor memory device 200a such as the control logic circuit 210.

Figure 15:
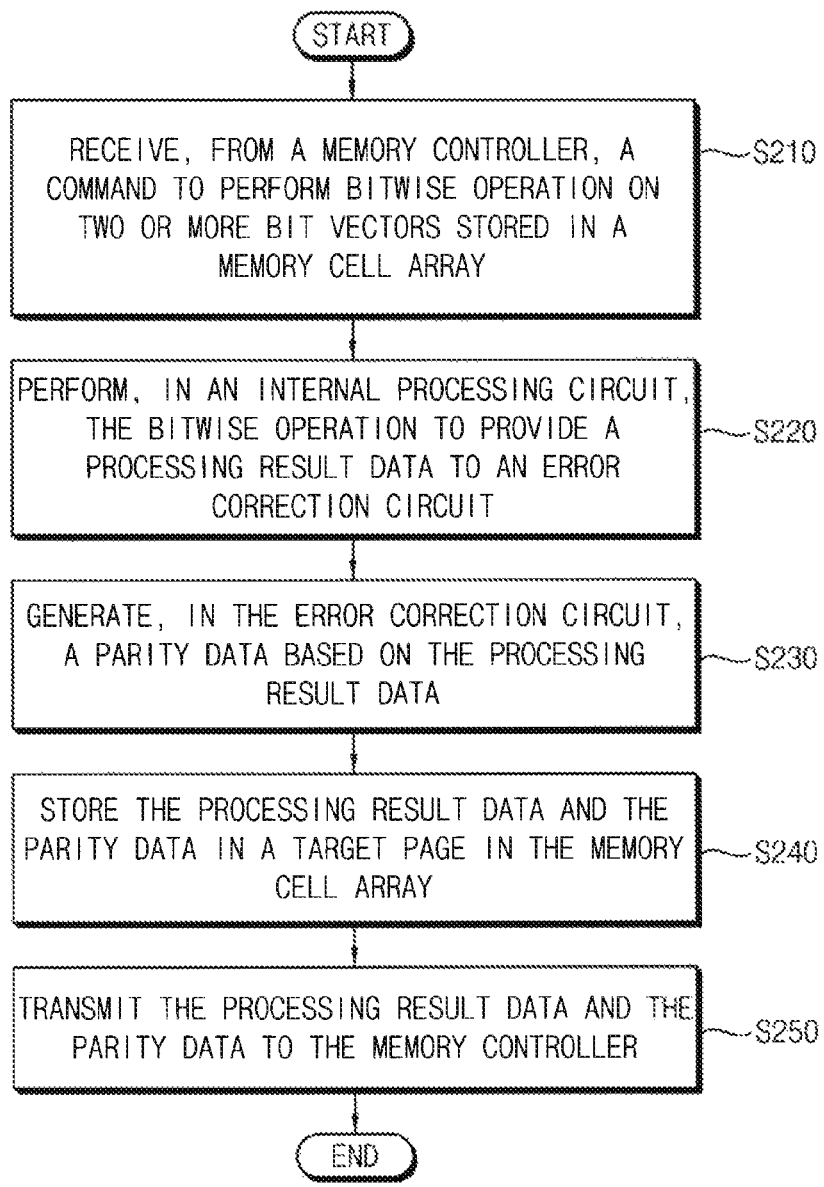
FIG. 15 is a flow chart illustrating a method of operating a semiconductor memory device according to exemplary embodiments.

FIG. 15 is a flow chart illustrating a method of operating a semiconductor memory device according to exemplary embodiments.

Referring to FIGS. 2 through 12 and 15, in a method of operating a semiconductor memory device 200a including a memory cell array 300 having a plurality of memory cells coupled to a plurality of word-lines and a plurality of bit-lines and a control logic circuit 210 to control access to the memory cell array 300, the control logic circuit 210 receives a command from a memory controller 100, an internal processing command CMD to perform a logical bitwise operation on two or more bit vectors stored in the memory cell array (S210). The semiconductor memory device 200a also receives an address ADDR designating two or more target pages of the memory cell array 300 along with the internal processing command CMD from the memory controller 100.

A row decoder 260 and an I/O gating circuit 290 of the semiconductor memory device 200a provides an internal processing circuit 390 with two or more bit vectors, each including a main data and a first parity data stored in two or more target pages. The internal processing circuit 390 performs an internal processing corresponding to the command CMD on the main data and provides an error correction circuit 400 with a processing result data corresponding to a result of the internal processing (S220).

A row decoder 260 and an I/O gating circuit 290 of the semiconductor memory device 200a provides the internal processing circuit 390 with two or more bit vectors, each including a main data and a first parity data stored in the target pages. The internal processing circuit 390 performs an internal processing corresponding to the command CMD on the main data and provides an error correction circuit 400 with a processing result data corresponding to a result of the internal processing (S220). The logical bitwise operation may be one of an OR operation, an AND operation, a NOT operation, a NAND operation, a NOR operation and an XOR operation.

The error correction circuit 400 generates a second parity data based on the processing result data (S230). The error correction circuit 400 selects the same ECC of a plurality of ECCs as a first ECC used for generating the first parity data and performs an ECC encoding using the same ECC to generate the second parity data.

The error correction circuit 400 provides the I/O gating circuit 290 with a second codeword including the processing result data and the second parity data to store the processing result data and the second parity in the target page of the memory cell array 300 (S240).

The error correction circuit 400 may transmit the processing result data and the second parity data to the memory controller 100 through the data I/O buffer 299 (S250). In an embodiment, the second parity data may be transmitted to the memory controller 100 simultaneously with the processing result data. In an embodiment, the second parity data may be transmitted to the memory controller 100 after the processing result data is transmitted to the memory controller 100.

FIG. 16 illustrates that a logical bitwise operation is performed in the semiconductor memory device of FIG. 3 according to exemplary embodiments.

Referring to FIGS. 3, 7 and 16, for a logical bitwise operation between two 8-bit operands stored in the first bank memory array 310, the 8 bits of one of the two operands may be transferred or read from appropriate memory cells 79 by corresponding sense amplifier 285*a*, as indicated by arrows 81. The sense amplifier 285*a* may transfer the received data bits to a buffer 391 for a first operand, as indicated by arrows 82. The second 8-bit operand (a second operand) for the logical bitwise operation may be received by the sense amplifiers 285*a* from the corresponding memory cells. The read data bits are directly transferred to a computing block 393 as indicated by arrows 84.

The computing block 393 may include necessary logics to perform the appropriate logical bitwise operation as instructed by the memory controller 100. For example, the computing block 393 may share some logic units or logic circuitry with the portion of the semiconductor memory device 200*a* implementing pop-count operations. The logical bitwise operation may include any of a number of different logical operations such as, for example, AND, OR, NOR, NAND, XOR, and the like. On conclusion of the designated logical bitwise operation between the first operand and the second operand, the computing block 393 may generate a processing result data, and may provide the processing result data to the error correction circuit 400 in FIG. 3. For example, the first operand may be a bit vector '11010010, whereas the second operand may be a bit vector '10001111'. In case of a logical bitwise AND operation between these two bit vectors, the computing block 393 may generate the processing result data '10000010' to the error correction circuit at arrows 85.

Figure 17:
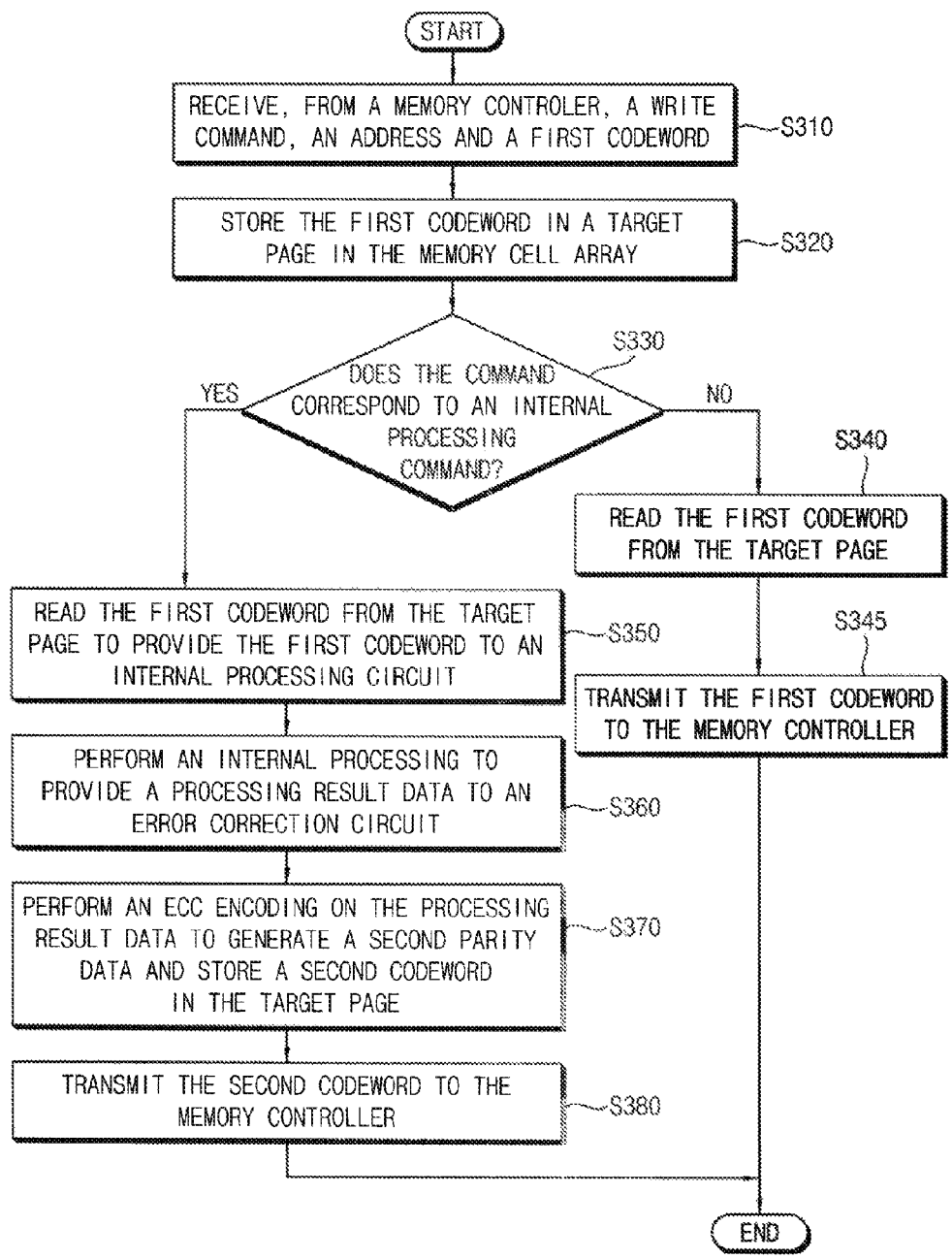
FIG. 17 is a flow chart illustrating a method of operating a memory system according to exemplary embodiments.

FIG. 17 is a flow chart illustrating a method of operating a memory system according to exemplary embodiments.

Referring to FIGS. 2 through 12 and 17, in a method of operating a memory system 20 including a semiconductor memory device 200*a* and a memory controller 100 to control the semiconductor memory device 200*a*, the semiconductor memory device 200*a* receives, from the memory controller 100, a write command CMD, an address ADDR and a first codeword CW1 including a main data and a first parity data (S310). The semiconductor memory device 200*a* stores the first codeword CW1 in a target page designated by the address ADDR, in the memory cell array 300 in response to the command CMD (S320).

The semiconductor memory device 200*a* determines whether a second command CMD from the memory controller 100 corresponds to an internal processing command (S330). When the second command CMD is a read command instead of the internal processing command (NO in S330), the semiconductor memory device 200*a* reads the first codeword CW1 from the target page (S340) and transmits the first codeword CW1 to the memory controller 100 (S345).

When the second command CMD is the internal processing command (YES in S330), the semiconductor memory device 200*a* reads the first codeword CW1 from the target page and provides the first codeword CW1 to an internal processing circuit 390 (S350). The internal processing circuit 390 performs an internal processing on the main data of the first codeword CW1 to generate a processing result data MD2 and provides the processing result data MD2 to the error correction circuit 400 (S360).

The error correction circuit 400 performs an ECC encoding on the processing result data MD2 to generate a second parity data and stores a second codeword CW2 including the processing result data MD2 and the second parity data in the target page (S370). The error correction circuit 400 selects a same ECC of a plurality of ECCs as an ECC which the memory controller 100 uses for generating the first parity data and performing the ECC encoding using the same ECC. The error correction circuit 400 may transmit the second codeword CW2 to the memory controller (S380).

Figure 18:
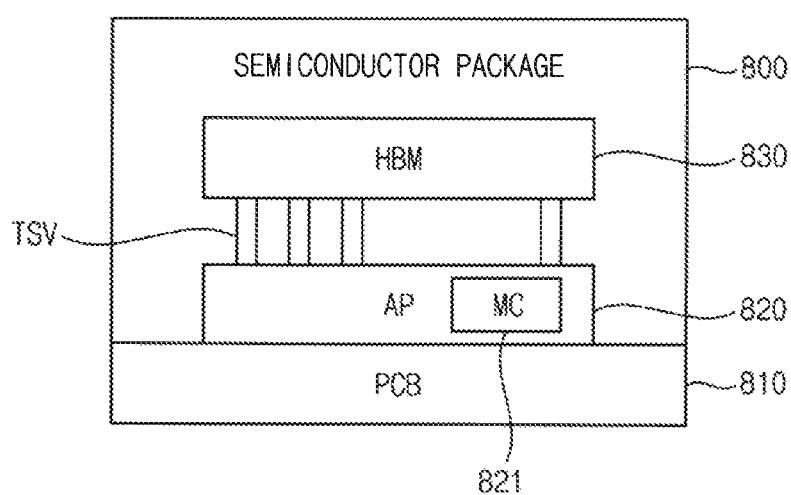
FIG. 18 is a cross-sectional view illustrating a package structure including the semiconductor memory device according to exemplary embodiments.

FIG. 18 is a cross-sectional view illustrating a package structure including the semiconductor memory device according to exemplary embodiments.

FIG. 18 illustrates a semiconductor package 800 whereby an application processor 820 and an HBM 830 are die-to-die interconnected.

Referring to FIG. 18, the application processor 820 and the HBM 830 are directly connected to each other for example using a through-substrate vias (e.g., through-silicon vias) TSVs technology. In this example, a package on package (PoP) method is not employed wherein the application processor 820 and the HBM 930 are independently packaged, and then the packages are repackaged again and connected to each other. Referring to FIG. 18, the application processor 820 is formed on a printed circuit board (PCB) 810, and then the application processor 820 and the HBM 830 are connected to each other through TSV.

The application processor 820 may include a memory controller 821 including a first error correction circuit which generates a first parity data using a first ECC and the HBM 830 may include the internal processing circuit and the second error correction circuit disclosed herein. The internal processing circuit and the second error correction circuit may be enabled in an internal processing mode and may perform above-mentioned internal processing operation and ECC encoding, respectively.

Figure 19:
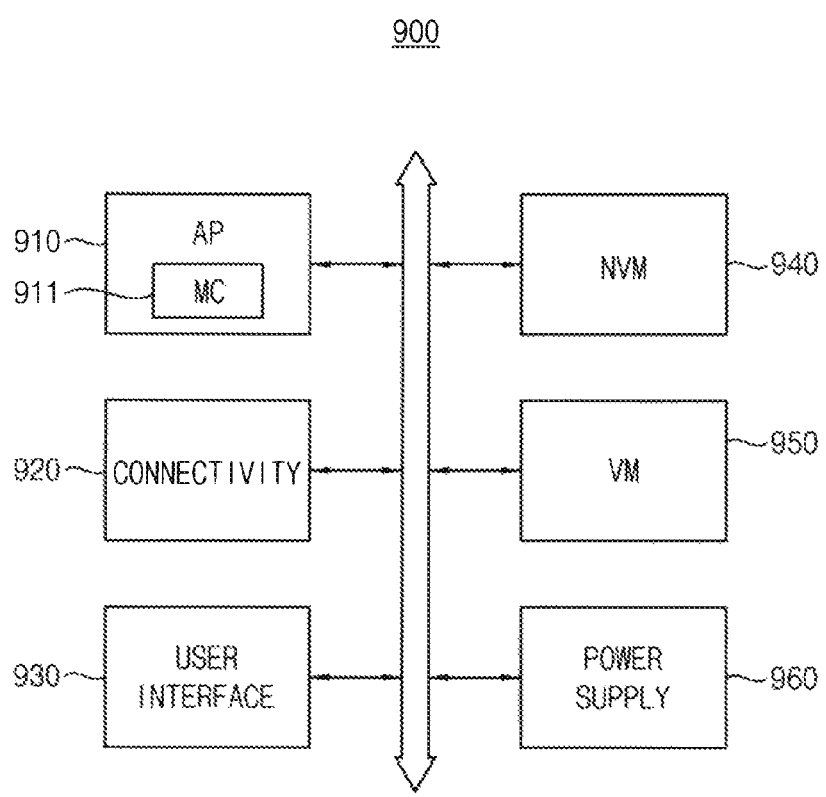
FIG. 19 is a block diagram illustrating a mobile system including the semiconductor memory device according to exemplary embodiments.

FIG. 19 is a block diagram illustrating a mobile system including the semiconductor memory device according to exemplary embodiments.

Referring to FIG. 19, a mobile system 900 may include an application processor 910, a connectivity unit 920, a user interface 930, a nonvolatile memory device 940, a volatile memory device 950 and a power supply 960. The application processor 910 may include a memory controller 911.

The application processor 910 may execute applications, such as a web browser, a game application, a video player, etc. The connectivity unit 920 may perform wired or wireless communication with an external device. The volatile memory device 950 may store data processed by the application processor 910 or operate as a working memory. The volatile memory device 950 may employ the semiconductor memory device 200 of FIG. 3.

The nonvolatile memory device 940 may store a boot image for booting the mobile system 900. The user interface 930 may include at least one input device, such as a keypad, a touch screen, etc., and at least one output device, such as a speaker, a display device, etc. The power supply 960 may supply a power supply voltage to the mobile system 900.

In some embodiments, the mobile system 900 and/or components of the mobile device 900 may be packaged in various forms.

The memory controller 911 may include a first error correction circuit which generates a first parity data using a first ECC and the volatile memory device 950 may include the internal processing circuit and the second error correction circuit disclosed herein. The internal processing circuit and the second error correction circuit may be enabled in an internal processing mode and may perform above-mentioned internal processing operation and ECC encoding, respectively.

Accordingly, the volatile memory device 950 according to exemplary embodiments may support in-memory processing and may greatly reduce transmission through memory-controller interface. Therefore, exemplary embodiments may save memory bandwidth and increase usability of the volatile memory device 950 by generating a second parity data using the same ECC of the ECCs as the first ECC in the memory controller 911.

Aspects of the present inventive concept may be applied to systems using semiconductor memory devices. For example aspects of the present inventive concept may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, or other such electronic devices.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present inventive concept. Accordingly, all such modifications are intended to be included within the present disclosure as defined in the claims.

What is claimed is:

1. A semiconductor memory device, comprising:
   a memory cell array including a plurality of memory cells coupled to a plurality of word-lines and a plurality of bit-lines;
   a control logic circuit configured to generate an internal processing mode signal designating whether to perform an internal processing operation in response to a command received from a memory controller;
   an internal processing circuit configured to output a processing result data by selectively performing the internal processing operation on a first set of data read from the memory cell array, in response to the internal processing mode signal, the first set of data including a main data and a first parity data; and
   an error correction circuit configured to generate a second parity data by performing an error correction code (ECC) encoding on the processing result data and configured to store the processing result data and the second parity data in the memory cell array,
   wherein the error correction circuit is configured to generate the second parity data by selecting the same ECC of a plurality of ECCs as a first ECC which is used for generating the first parity data of the first set of data.

2. The semiconductor memory device of claim 1, wherein the error correction circuit comprises:
   a plurality of storage devices configured to store the plurality of ECCs, respectively; and
   an ECC engine connected to the plurality of storage devices, and configured to generate the second parity data by performing the ECC encoding on the processing result data using the same ECC of the plurality of ECCs, in response to a control signal from the control logic circuit.

3. The semiconductor memory device of claim 1, wherein the control logic circuit comprises:
   a mode register configured to generate the internal processing mode signal in response to the command; and
   a command decoder configured to generate a control signal to control the error correction circuit by decoding the command.

4. The semiconductor memory device of claim 1, further comprising:
   an input/output (I/O) gating circuit connected between the memory cell array and the error correction circuit,
   wherein the I/O gating circuit is configured to change a location in a target page of the memory cell array, in which the second parity data is stored, in response to a control signal from the control logic circuit.

5. The semiconductor memory device of claim 4, wherein the I/O gating circuit is configured to store the second parity data in a location corresponding to lower bit addresses of the target page and to store the processing result data in a remaining location corresponding to others than the lower bit addresses of the target page, in response to the control signal, and
   wherein the target page of the memory cell array is configured to store the processing result data and the second parity data.

6. The semiconductor memory device of claim 4, wherein the I/O gating circuit is configured to store the second parity data in a location corresponding to upper bit addresses of the target page and to store the processing result data in a remaining location corresponding to addresses other than the upper bit addresses of the target page, in response to the control signal, and
   wherein the target page of the memory cell array is configured to store the processing result data and the second parity data.

7. The semiconductor memory device of claim 4, wherein the I/O gating circuit comprises:
   a cross-bar switch connected to the memory cell array; and
   a plurality of switches connected between the cross-bar switch and the error correction circuit, the plurality of switches configured to transfer the processing result data and the second parity data to the cross-bar switch.

8. The semiconductor memory device of claim 1, wherein the error correction circuit is configured to transmit the processing result data and the second parity data to the memory controller through a data input/output buffer.

9. The semiconductor memory device of claim 1, wherein the internal processing operation includes a pop-count operation on the first set of data stored in a target page of the memory cell array.

10. The semiconductor memory device of claim 1, wherein the internal processing operation includes a logical bitwise operation on two sets of data stored in at least two target pages of the memory cell array.

11. The semiconductor memory device of claim 10, wherein the logical bitwise operation includes one of an OR operation, an AND operation, a NOT operation, a NAND operation, a NOR operation and an XOR operation.

12. The semiconductor memory device of claim 1, further comprising:
a path selection circuit configured to selectively provide the first set of data to the internal processing circuit in response to the internal processing mode signal.

13. The semiconductor memory device of claim 1, wherein the semiconductor memory device includes a high bandwidth memory (HBM).

14. A memory system comprising:
at least one semiconductor memory device; and
a memory controller configured to control the at least one semiconductor memory device, wherein the memory controller is configured to generate a first parity data by performing an error correction code (ECC) encoding on a write data using a first ECC and configured to transmit the write data and the first parity data to the at least one semiconductor memory device,
wherein the at least one semiconductor memory device comprises:
a memory cell array including a plurality of memory cells coupled to a plurality of word-lines and a plurality of bit-lines, and configured to store the write data and the first parity data;
a control logic circuit configured to generate an internal processing mode signal designating whether to perform an internal processing operation in response to a command received from the memory controller;
an internal processing circuit configured to output a processing result data by selectively performing the internal processing operation on a first set of data including the write data and the first parity data, in response to the internal processing mode signal; and
a first error correction circuit configured to generate a second parity data by performing an ECC encoding on the processing result data and configured to store the processing result data and the second parity data in the memory cell array,
wherein the first error correction circuit is configured to generate the second parity data by selecting the same ECC of a plurality of ECCs as the first ECC which the memory controller uses for generating the first parity data.

15. The memory system of claim 14, wherein the memory controller comprises a second error correction circuit configured to generate the first parity data by performing the ECC encoding on the write data.

16. The memory system of claim 14, wherein the memory controller is configured to transmit the first parity data to the at least one semiconductor memory device simultaneously with the write data.

17. The memory system of claim 14, wherein the memory controller is configured to transmit the first parity data to the at least one semiconductor memory device after transmitting the write data to the at least one semiconductor memory device.

18. A semiconductor memory device comprising:
a memory cell array including a plurality of memory cells;
an error correction circuit configured to generate a corrected data by performing an error correction on a read data from the memory cell array, the read data including a first main data and a first parity data; and
an internal processing circuit configured to generate a first processed data by performing an internal processing on the corrected data including a second main data and a second parity data,
wherein the error correction circuit is further configured to generate a third parity data by performing an error correction on the first processed data, and store the third parity data and the first processed data in the memory cell array.

19. The semiconductor memory device of claim 18, wherein the error correction circuit is further configured to generate a corrected write data by performing an error correction on a write data received from a memory controller, the write data including a main data and a parity data,
wherein the internal processing circuit is further configured to generate a second processed data by performing an internal processing on the corrected write data, and
wherein the error correction circuit is further configured to generate a fourth parity data by performing an error correction on the second processed data, and store the fourth parity data and the second processed data in the memory cell array.

20. The semiconductor memory device of claim 18, wherein the error correction circuit includes a plurality of storage devices configured to store an error correction code (ECC), respectively, and is configured to perform the error correction using one of the plurality of storage devices, and
wherein the ECCs comprise at least one of a single error correction (SEC) code, a single error correction and double error detection (SECDED) code, and double error correction (DEC) code.

* * * * *